United States Patent
Cano Salomo et al.

(10) Patent No.: US 11,936,128 B2
(45) Date of Patent: Mar. 19, 2024

(54) ELECTRICAL UNIT WITH OFFSET TERMINALS

(71) Applicant: Lear Corporation, Southfield, MI (US)

(72) Inventors: Oscar Cano Salomo, Valls (ES); Marcos Blanco Figueras, Valls (ES); Gerard Vall Gendre, Valls (ES); Joan Ignasi Ferran Palau, Valls (ES); Antoni Pujol Simon, Valls (ES)

(73) Assignee: LEAR CORPORATION, Southfield, MI (US)

( * ) Notice: Subject to any disclaimer, the term of this patent is extended or adjusted under 35 U.S.C. 154(b) by 161 days.

(21) Appl. No.: 17/171,613

(22) Filed: Feb. 9, 2021

(65) Prior Publication Data

US 2022/0255252 A1 Aug. 11, 2022

(51) Int. Cl.
*H01R 12/72* (2011.01)
*H01R 12/55* (2011.01)
*H01R 12/71* (2011.01)
*H01R 13/04* (2006.01)
*H01R 12/50* (2011.01)
*H01R 12/51* (2011.01)

(52) U.S. Cl.
CPC .......... *H01R 12/727* (2013.01); *H01R 12/55* (2013.01); *H01R 12/716* (2013.01); *H01R 13/04* (2013.01); *H01R 12/50* (2013.01); *H01R 12/51* (2013.01); *H01R 12/71* (2013.01); *H01R 12/712* (2013.01); *H01R 12/722* (2013.01); *H01R 2201/26* (2013.01)

(58) Field of Classification Search
CPC .... H01R 12/727; H01R 12/55; H01R 12/716; H01R 13/04; H01R 12/50; H01R 12/51; H01R 12/71; H01R 12/712; H01R 12/722; H01R 2201/26
See application file for complete search history.

(56) References Cited

U.S. PATENT DOCUMENTS

| 3,154,631 A | 10/1964 | Mauviel |
| 4,451,109 A | 5/1984 | Inoue |
| 4,752,254 A | 6/1988 | Inoue et al. |

(Continued)

FOREIGN PATENT DOCUMENTS

| CN | 1581593 A | * | 2/2005 | ......... H01R 13/6315 |
| CN | 201303124 Y | * | 9/2009 | ........... H01R 13/665 |

(Continued)

*Primary Examiner* — Abdullah A Riyami
*Assistant Examiner* — Justin M Kratt
(74) *Attorney, Agent, or Firm* — Fishman Stewart PLLC

(57) ABSTRACT

An electrical unit includes a circuit board, a plurality of first terminals having respective first tabs fixed to the circuit board, a plurality of second terminals having respective second tabs fixed to the circuit board, the second tabs offset from the first tabs in a first direction and a second direction, and/or a terminal housing disposed over the plurality of first terminals and the plurality of second terminals, and connected to the circuit board. A method of assembling an electrical unit includes connecting first tabs with the circuit board, connecting second tabs with the circuit board such that each second tab is at least partially offset from each of the first tabs the plurality of first terminals in a first direction and a second direction, and/or disposing the terminal housing over the first and second terminals.

19 Claims, 24 Drawing Sheets

(56) References Cited

U.S. PATENT DOCUMENTS

| | | |
|---|---|---|
| 4,954,090 A | 9/1990 | Shimochi |
| 5,076,795 A | 12/1991 | Krupp et al. |
| 5,340,320 A | 8/1994 | Puerner |
| 5,358,413 A | 10/1994 | Daly et al. |
| 5,453,016 A | 9/1995 | Clark et al. |
| 5,702,257 A | 12/1997 | Millhimes |
| 5,947,754 A | 9/1999 | Lin |
| 6,106,308 A | 8/2000 | Chen et al. |
| 6,270,360 B1 | 8/2001 | Yanase |
| 6,325,640 B1 | 12/2001 | Kasai |
| 6,359,543 B2 | 3/2002 | Endo et al. |
| 6,468,091 B2 | 10/2002 | Roussel et al. |
| 6,511,331 B2 | 1/2003 | Saito et al. |
| 6,514,091 B2 | 2/2003 | Saito et al. |
| 6,556,120 B2 | 4/2003 | Endo et al. |
| 6,558,198 B2 | 5/2003 | Kobayashi et al. |
| 6,753,753 B2 | 6/2004 | Endo et al. |
| 6,824,398 B2 | 11/2004 | Hara |
| 6,863,543 B2 | 3/2005 | Lang et al. |
| 6,881,077 B2 | 4/2005 | Throum |
| 6,891,463 B2 | 5/2005 | Nagaoka |
| 7,004,798 B2 | 2/2006 | Yuasa et al. |
| 7,050,305 B2 | 5/2006 | Thorum |
| 7,153,145 B2 | 12/2006 | Sekido |
| 7,201,587 B1 | 4/2007 | Eichorn et al. |
| 7,249,956 B2 | 7/2007 | Ishiguro et al. |
| 7,364,449 B2 | 4/2008 | Makino |
| 7,488,219 B2 | 2/2009 | Matsumura |
| 7,710,236 B2 | 5/2010 | Jozwiak |
| 7,727,022 B2 | 6/2010 | Polehonki et al. |
| 7,753,733 B2 | 7/2010 | Kameyama et al. |
| 7,760,511 B2 | 7/2010 | Sasaki et al. |
| 7,857,665 B2 * | 12/2010 | Xiong ............... H01R 12/712 439/79 |
| 8,011,936 B2 * | 9/2011 | Goto ................. H05K 7/026 439/341 |
| 8,057,240 B2 | 11/2011 | Morgan |
| 8,556,666 B2 | 10/2013 | Brandon et al. |
| 8,573,987 B1 | 11/2013 | Schweitzer et al. |
| 9,282,655 B2 | 3/2016 | Stern et al. |
| 9,627,785 B1 | 4/2017 | Melchor Saucedo et al. |
| 9,715,986 B2 | 7/2017 | Neto et al. |
| 9,882,295 B2 | 1/2018 | Miura et al. |
| 10,236,602 B2 | 3/2019 | Palau et al. |
| 10,308,197 B2 | 6/2019 | Ikegaya |
| 10,834,834 B2 | 11/2020 | Mitsui |
| 2002/0031930 A1 | 3/2002 | Metz |
| 2004/0196135 A1 | 10/2004 | Clair |
| 2011/0124206 A1 | 5/2011 | Goto |
| 2014/0211379 A1 | 7/2014 | Borowicz et al. |

FOREIGN PATENT DOCUMENTS

| | | | | |
|---|---|---|---|---|
| CN | 201956471 U | | 8/2011 | |
| CN | 104348003 A | | 2/2015 | |
| CN | 105098539 A | * | 11/2015 | ............ H01R 12/51 |
| DE | 19753278 C1 | | 7/1999 | |
| DE | 10310159 B4 | | 7/2006 | |
| DE | 102008051545 B4 | | 2/2017 | |
| EP | 3276754 A1 | * | 1/2018 | ........... H01R 12/718 |
| FR | 2813711 B1 | | 1/2004 | |
| WO | 14046779 A2 | | 3/2014 | |

\* cited by examiner

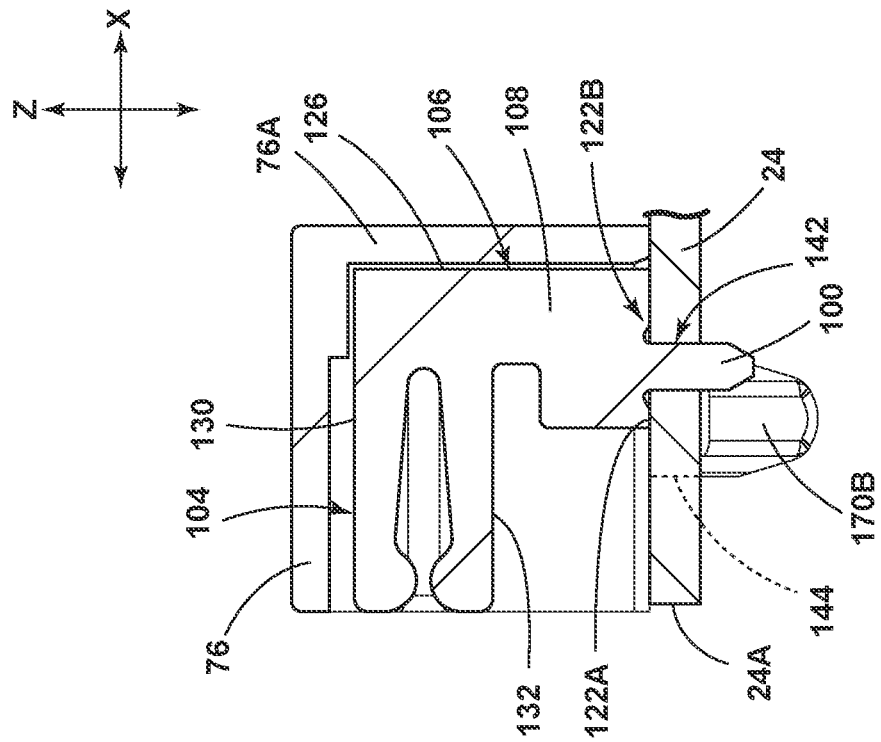

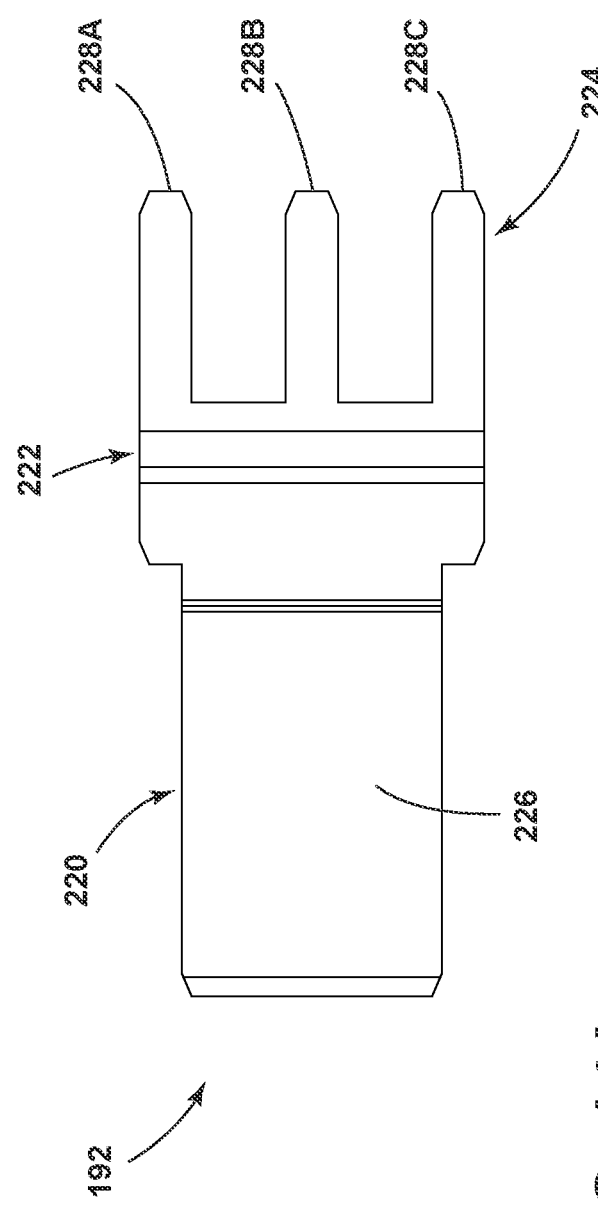
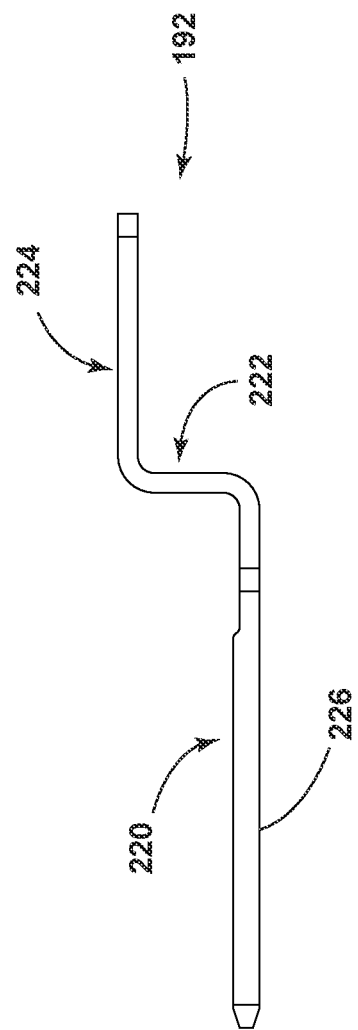
FIG. 14A
FIG. 14B

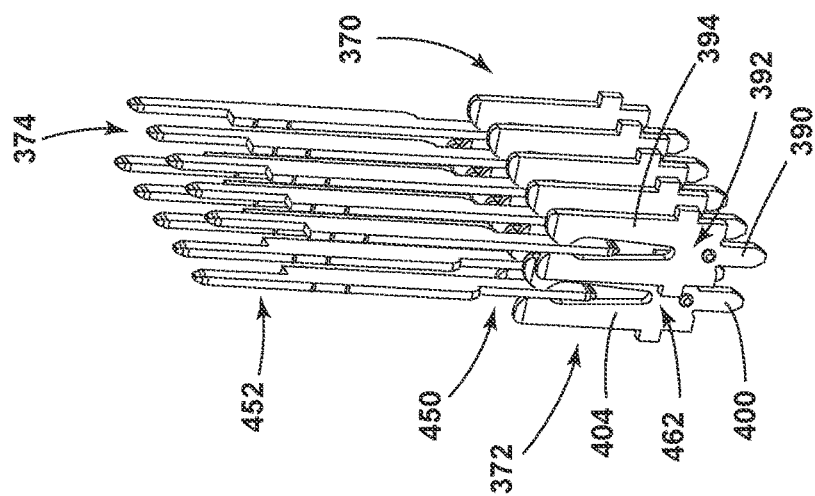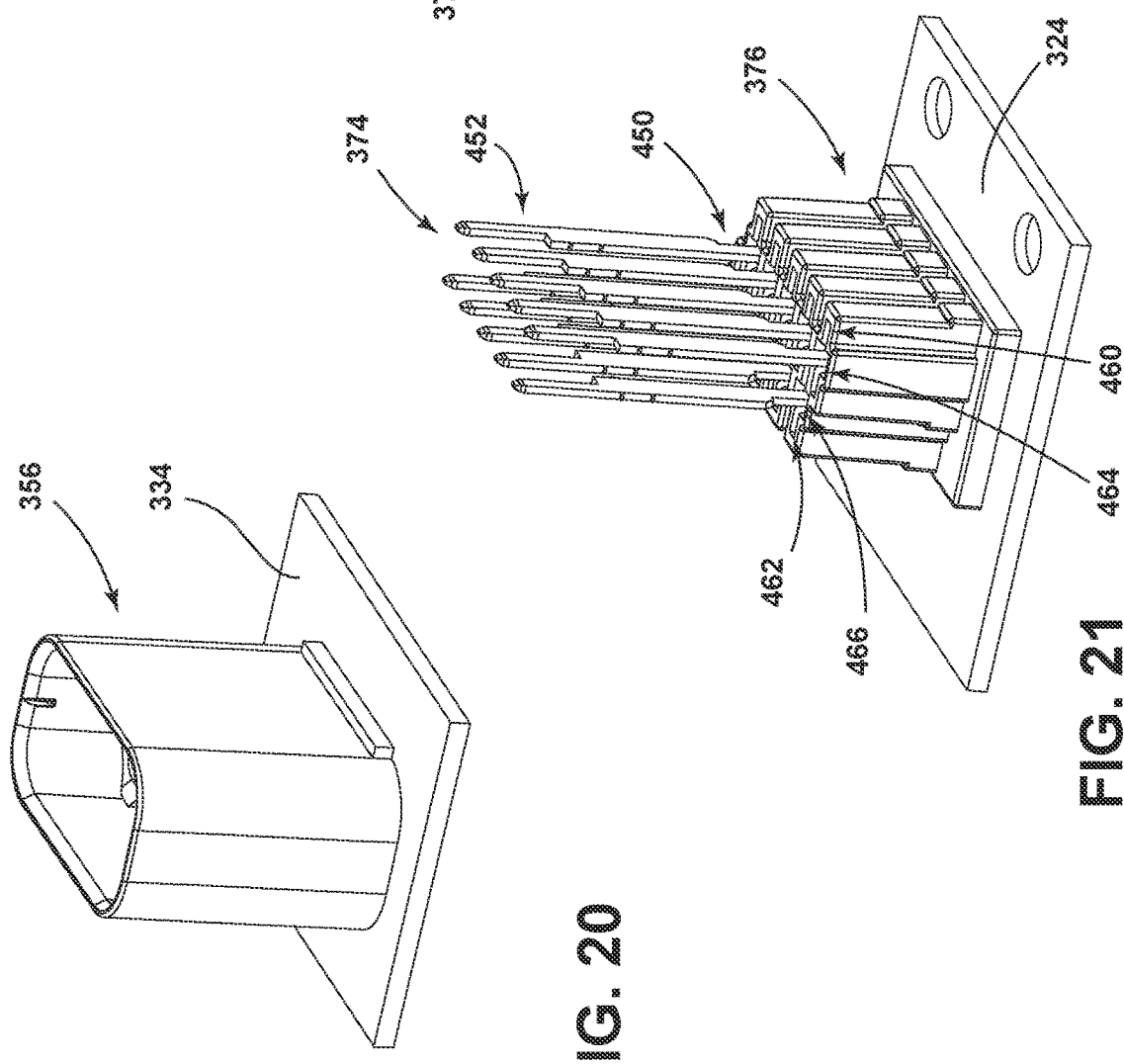

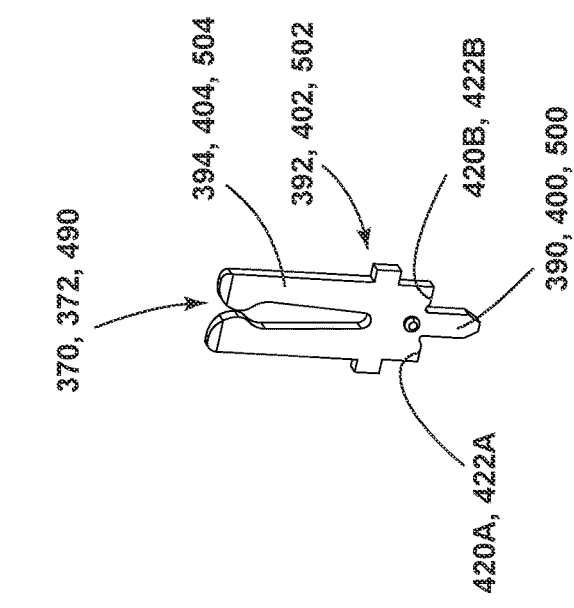
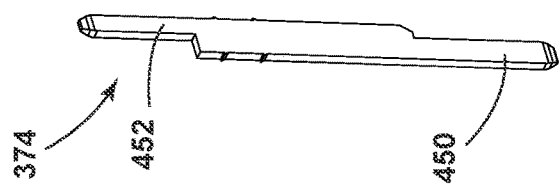
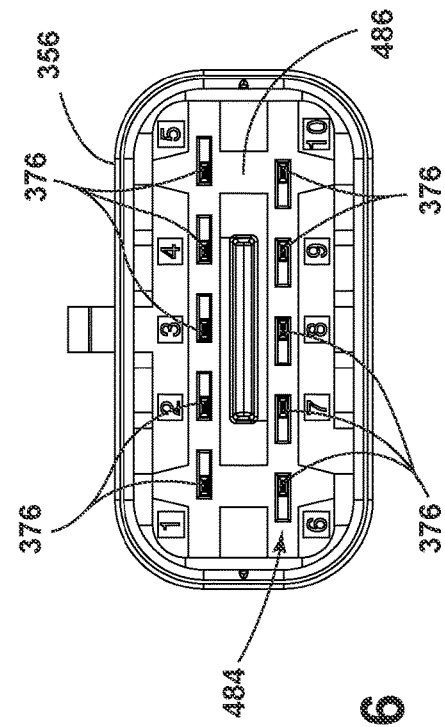
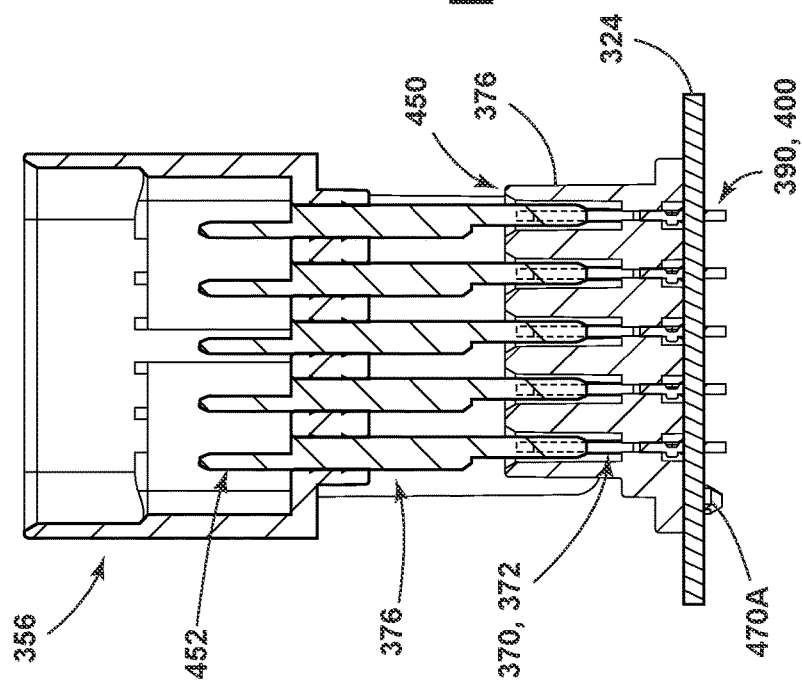

ELECTRICAL UNIT WITH OFFSET TERMINALS

TECHNICAL FIELD

The present disclosure generally relates to electrical units, including electrical units that may, for example, be utilized as power distribution units and/or in connection with vehicles.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some circuit board designs are not space efficient, are not configured for high currents, and/or are complex to use and assemble.

There is a desire for solutions/options that minimize or eliminate one or more challenges or shortcomings of circuit board assemblies. The foregoing discussion is intended only to illustrate examples of the present field and is not a disavowal of scope.

SUMMARY

In embodiments, an electrical unit may include a circuit board, a plurality of first terminals having respective first tabs fixed to the circuit board, a plurality of second terminals having respective second tabs fixed to the circuit board, the second tabs offset from the first tabs in a first direction and a second direction, and/or a terminal housing disposed over the plurality of first terminals and the plurality of second terminals, and connected to the circuit board.

With embodiments, a method of assembling an electrical unit may include connecting first tabs of a plurality of first terminals with a circuit board, connecting second tabs of a plurality of second terminals with the circuit board such that each second tab is at least partially offset from each of the first tabs the plurality of first terminals in a first direction and a second direction, disposing a terminal housing over the plurality of first terminals and the plurality of second terminals, and/or connecting the terminal housing to the circuit board.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and are not restricted to the precise form and configuration shown in the drawings or disclosed in the following detailed description. Exemplary illustrations are described in detail by referring to the drawings as follows:

FIGS. 4A and 4B are cross-sectional views generally illustrating embodiments of a terminal housing, a circuit board, and terminals according to teachings of the present disclosure.

FIGS. 14A and 14B are side views generally illustrating embodiments of terminals according to teachings of the present disclosure.

FIG. 20 is a perspective view generally illustrating an embodiment of a connector portion according to teachings of the present disclosure.

FIG. 21 is a perspective view generally illustrating embodiments of a terminal housing, a circuit board, and terminals according to teachings of the present disclosure.

FIG. 22 is a perspective view generally illustrating embodiments of terminals according to teachings of the present disclosure.

FIG. 23 is a cross-sectional view generally illustrating portions of an embodiment of an electrical unit according to teachings of the present disclosure.

FIGS. 24 and 25 are perspective views generally illustrating embodiments of terminals according to teachings of the present disclosure.

FIG. 26 is a top view generally illustrating an embodiment of a connector portion according to teachings of the present disclosure.

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
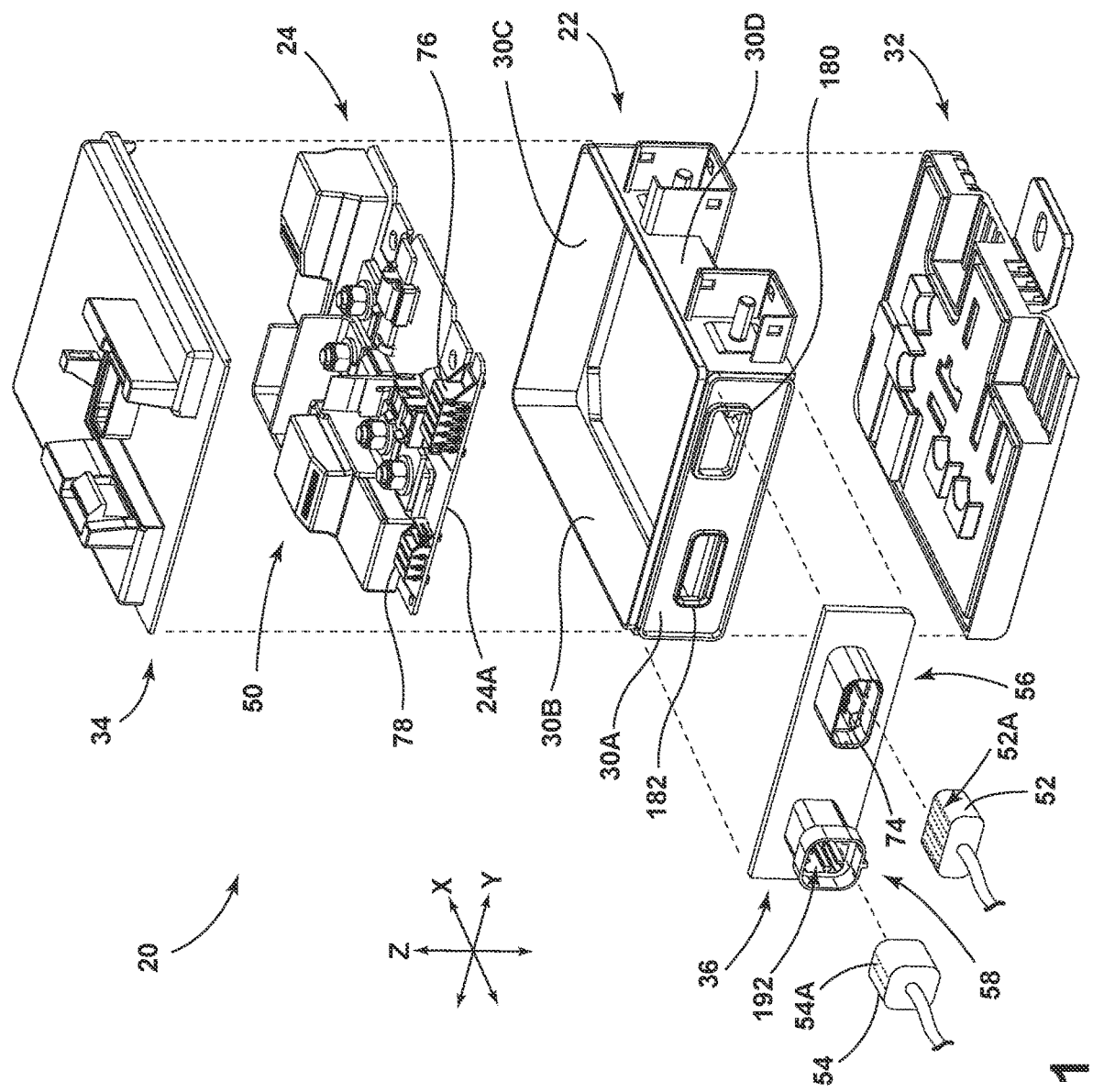
FIG. 1 is an exploded perspective view generally illustrating an embodiment of an electrical unit according to teachings of the present disclosure.

In embodiments, such as generally illustrated in FIG. 1, an electrical unit 20 may include an electrical unit housing 22 and/or a circuit board 24 that may be disposed at least partially in the electrical unit housing 22. The electrical unit housing 22 may include a side wall 30, a lower cover 32, an upper cover 34, and/or a connector wall 36. The side wall 30 may include a first portion 30A, a second portion 30B, a third portion 30C, and/or a fourth portion 30D that may be disposed in a rectangular configuration and may extend between the lower cover 32 and the upper cover 34 to provide an inner space 38 in which the circuit board 24 may be at least partially disposed. The connector wall 36 may be disposed adjacent to and/or may be connected to the first portion 30A of the side wall 30.

With embodiments, one or more electrical components 50 may be connected to the circuit board 24. The one or more electrical components 50 may, for example and without limitation, include relays, controllers, fuses, capacitors, resistors, and/or inductors, among others. The circuit board 24 may, for example, be substantially parallel to an X-Y plane and/or substantially perpendicular to a Z-direction (e.g., a vertical direction). A first terminal housing 76 and/or a second terminal housing 78 may be connected to the circuit board 24, such as at or about an edge 24A of the circuit board 24.

Figure 2:
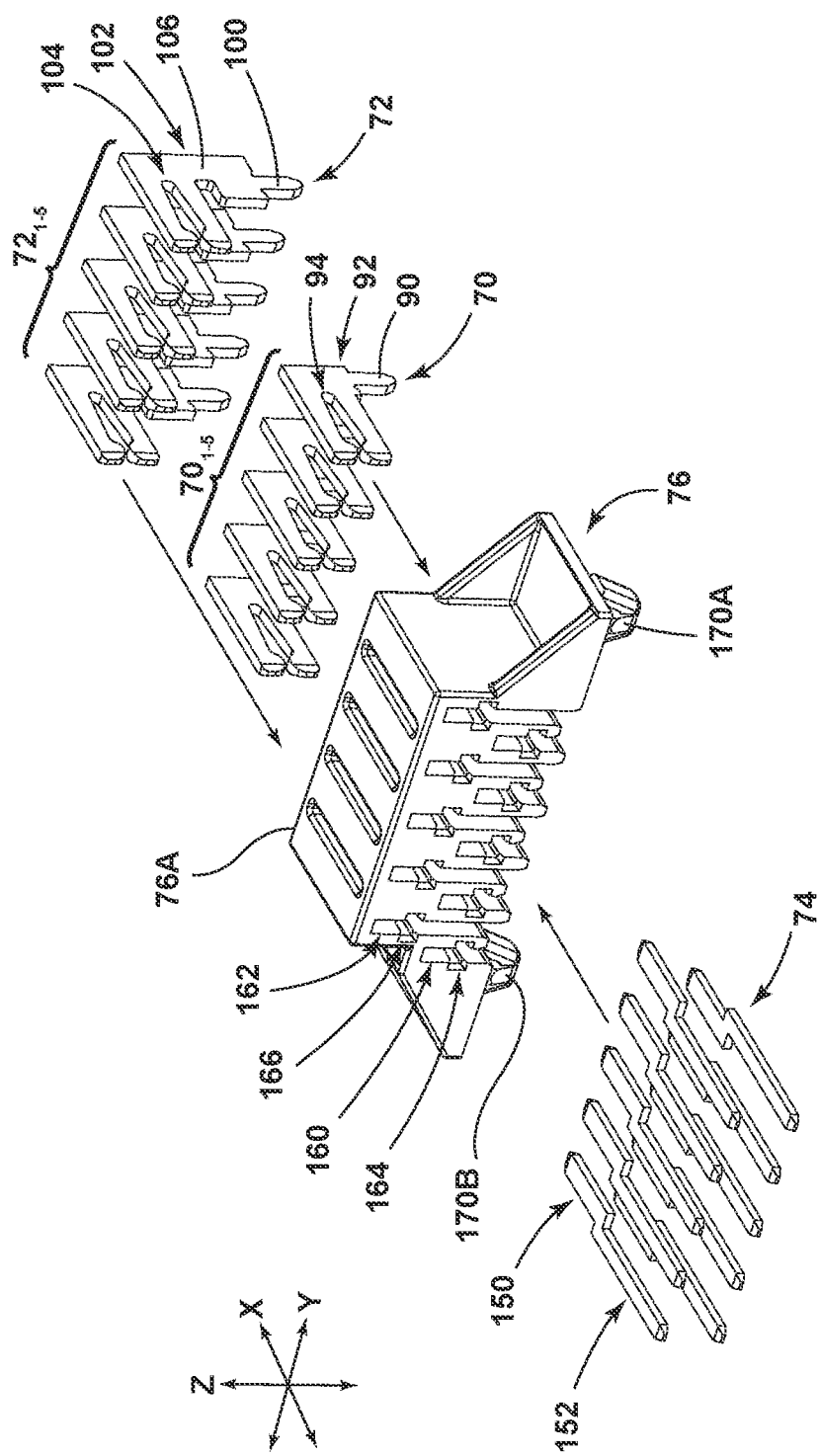
FIG. 2 is an exploded perspective view generally illustrating embodiments of a terminal housing and terminals according to teachings of the present disclosure.

In embodiments, an electrical unit 20 may be configured for connection with one or more external electrical connectors, such as a first external connector 52 and/or a second external connector 54. The connector wall 36 may include a first connector portion 56 configured for connection with the first external connector 52 and/or may include a second connector portion 58 configured for connection with the second external connector 54. The connector wall 36 may be disposed substantially perpendicular to the circuit board 24 and/or substantially parallel to a Y-Z plane. The electrical unit 20 may include a plurality of terminals configured to provide an electrical connection between the external connectors 52, 54 and the circuit board 24 and/or electrical components 50 connected thereto. For example and without limitation, an electrical unit 20 may include a plurality of first terminals 70 (e.g., first terminals $70_{1-5}$), a plurality of second terminals 72 (e.g., second terminals $72_{1-5}$), and/or a plurality of third terminals 74 (e.g., third terminals $74_{1-10}$), some or all of which may be disposed at least partially in a first terminal housing 76 (see, e.g., FIG. 2). The first terminal housing 76 may be disposed at or about an edge 24A of the circuit board 24.

With embodiments, such as generally illustrated in FIGS. 2, 3, 4A, 4B, 5A, and 5B, the first terminals 70 may include an L-shaped configuration with a tab 90 extending generally downward (e.g., in a Z-direction) for connection with the circuit board 24 and a mating portion 92 for mating with respective third terminals 74. The mating portion 92 may include a pair of prongs 94 that may extend substantially perpendicular to the tab 90, such as in an X-direction (e.g., first terminals 70 may be configured as female terminals). The second terminals 72 may include a tab 100 extending generally downward for connection with the circuit board 24 and a mating portion 102 for mating with respective third terminals 74. The mating portion 102 may include a pair of prongs 104 that may extend substantially perpendicular to the tab 100, such as in an X-direction (e.g., second terminals 72 may be configured as female terminals). The second terminals 72 may include a neck 106 disposed between the tab 100 and the prongs 104. The neck 106 may extend generally upward. The neck may include a narrow portion 108 (e.g., with a reduced X-dimension) that may facilitate deflection of a second terminal 72 (e.g, in one or both X-directions), such as upon/during connection with a third terminal 74.

Figure 6:
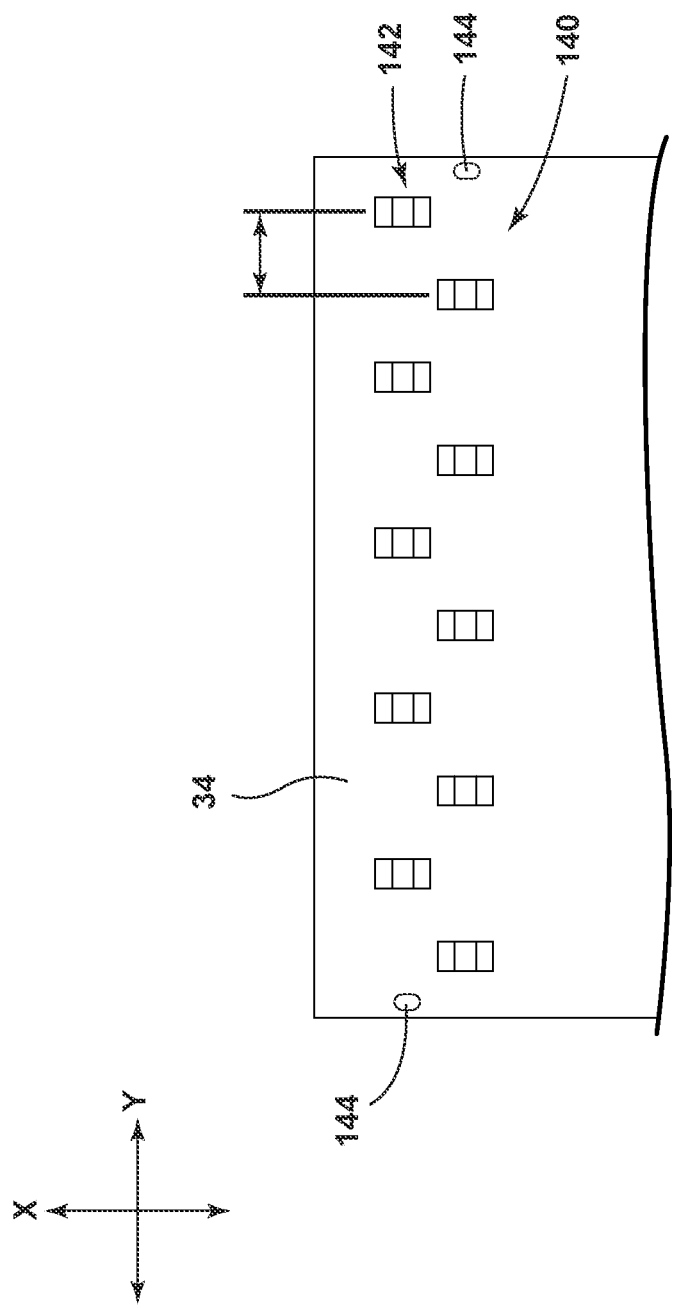
FIG. 6 is a top view generally illustrating an embodiment of a circuit board according to teachings of the present disclosure.
Figure 7:
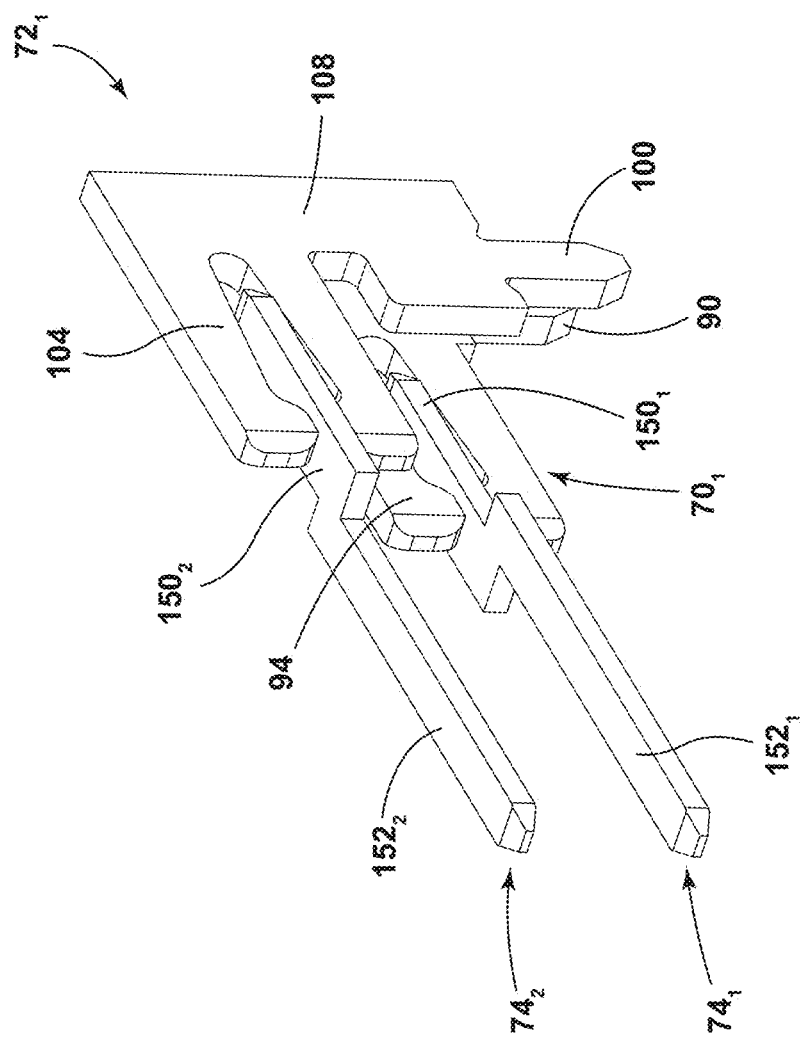
FIG. 7 is a perspective view generally illustrating embodiments of terminals according to teachings of the present disclosure.
Figure 8:
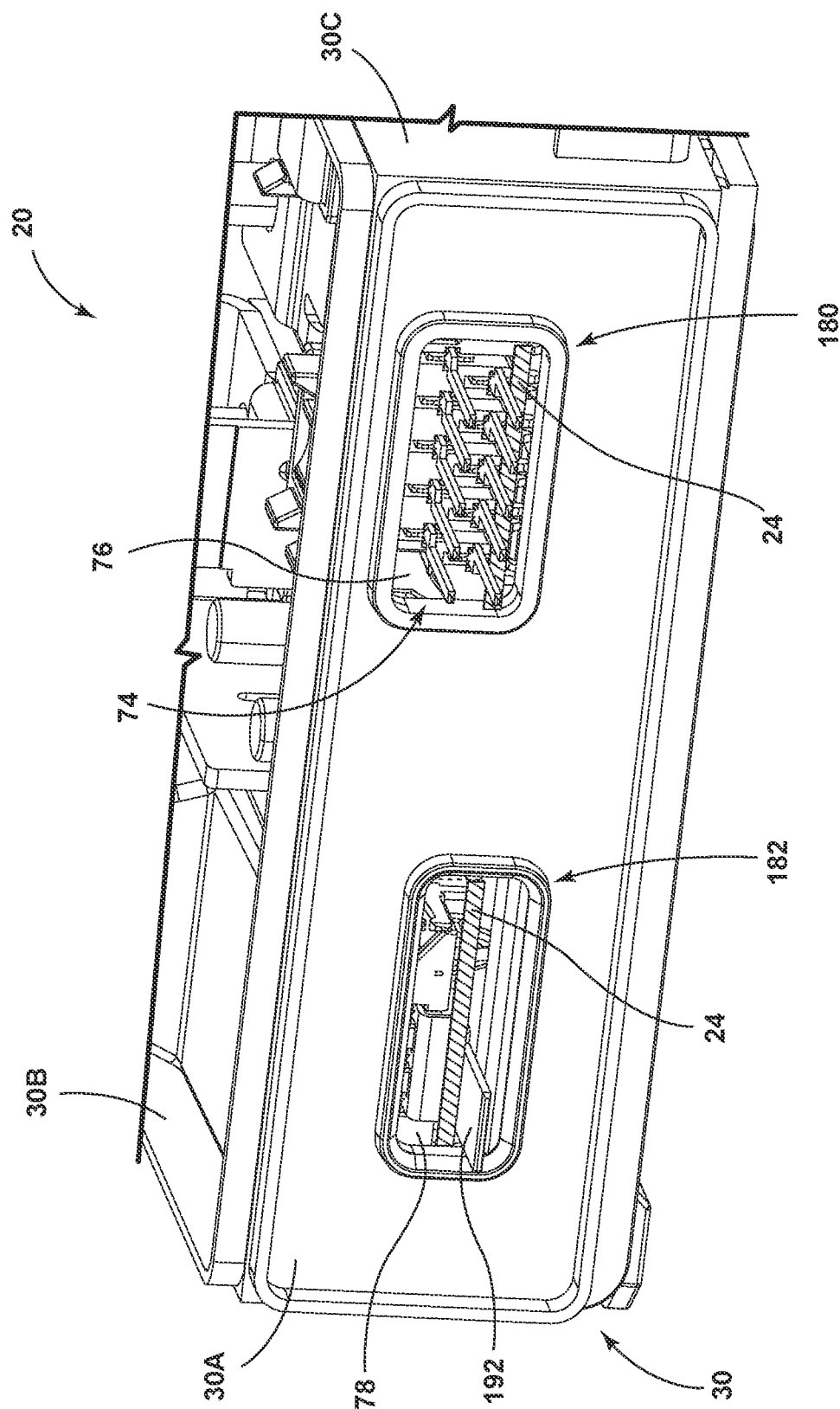
FIGS. 8-10 are perspective views generally illustrating portions of embodiments of electrical units according to teachings of the present disclosure.

In embodiments, the first terminals 70 and the second terminals 72 may include contact portions 120A, 120B, 122A, 122B that may be configured to contact the circuit board 24 and/or limit insertion depth of the terminals 70, 72 into the circuit board 24. The first contact portions 120A, 122A of the first and second terminals 70, 72 may be similar or substantially the same in shape/size. The second contact portions 120B, 122B of the terminals 70, 72 may include different shapes/sizes. For example and without limitation, the second terminals 72 may include second contact portions 122B that include larger X-dimensions than the second contact portions 120B of the first terminals 70, such as if tabs 100 of the second terminals 72 are connected to apertures 142 that are closer to the edge 24A of the circuit board 24 than apertures 140 in which tabs 90 of the first terminals 70 may be connected (see, e.g., FIGS. 4A, 4B, and 6). A larger X-dimension may facilitate disposing the terminals in a staggered configuration while also disposing rear edges 124, 126 of the terminals 70, 72 adjacent and/or in contact with a rear wall 76A of the terminal housing 76. If the tabs 90 of the first terminals 70 are connected closer to the edge 24A of the circuit board 24 than the tabs 100 of the second terminals 72 (e.g., if apertures 140 are closer to the edge 24A than apertures 142), the second contact portions 120B of the first terminals 70 may have a larger X-dimension than the second contact portions 122B of the second terminals 72.

In embodiments, the first terminals 70 and/or the second terminals 72 may be substantially planar. For example and without limitation, when connected to the circuit board 24, the first terminals 70 and the second terminals 72 may be substantially parallel to each other and/or an X-Z plane.

With embodiments, such as generally illustrated in FIGS. 2-5B, the second terminals 72 may be taller than the first terminals 70. For example and without limitation, when connected to the circuit board 24, top edges 128 of the first terminals 70 may be disposed at a distance D1 from the circuit board 24 (e.g., in a Z-direction), and top edges 130 of the second terminals 72 may be disposed at a distance D2 from the circuit board 24 that may be larger than the first distance D1. In some configurations, bottom edges 132 of mating portions 102/prongs 104 of the second terminals 72 may be disposed at a distance D3 from the circuit board 24 that may be similar to or the same as the distance D1 (e.g., the top edges 128 of the first terminals 70 may be disposed at substantially the same height as bottom edges 132 of the second terminals 72). Such a configuration may reduce the total height of the first terminal housing 76. For example, if the first terminals 70 and the second terminals 72 were in a stacked configuration with the second terminals 72 directly above the first terminals 70 in a Z-direction, the bottom edges 132 of the second terminals 72 may need to be raised to a greater distance/height (e.g., greater than D1/D3) to provide a minimum clearance from the first terminals 70, which may also raise the upper edges 130 of the second terminals 72 and increase the height of the terminal housing 76, which may be undesirable and/or may not be feasible with at least some configurations. For example, terminals 52A of an electrical connector 52 may be disposed close enough together such that stacking terminals 70, 72 vertically may not be possible while maintaining proper separation distances.

With embodiments, such as generally illustrated in FIGS. 3, 6, 7, and 10, first terminals 70 and second terminals 72 may be disposed in an alternating and/or staggered configuration. For example and without limitation, a second terminal 72 may be disposed at least partially between (e.g., in a Y-direction) pairs of first terminals 70 such that the terminals 70, 72 are disposed in a first-second-first-second alternating configuration. Additionally or alternatively, tabs 100 of the second terminals 72 may be connected to the circuit board 24 closer to the edge 24A of the circuit board 24 than tabs 90 of the first terminals 70, which may provide a staggered configuration. For example and without limitation, the first terminals 70 may be inserted and/or soldered in first apertures 140 of the circuit board 24, and the second terminals 72 may be inserted and/or soldered in second apertures 142 of the circuit board 24 that may be disposed closer to the edge 24A (e.g., in an X-direction) than the first apertures 140. With an alternating and staggered configuration, tabs 90, 100 of first and second terminals 70, 72 may be offset in a first direction (e.g., an X-direction) and a second direction (e.g., a Y-direction), and/or prongs 94, 104 of first and second terminals 70, 72 may be offset in the second direction (e.g., in a Y-direction) and a third direction (e.g., a Z-direction), which may provide minimum clearances between the tabs 90, 100 and the prongs 94, 104 while minimizing a total height and/or footprint (e.g., by allowing for a tight pitch, maintaining solder pad dimensions, etc.) on the circuit board 324 of the terminals 70, 72 and the first terminal housing 76. In some circumstances, second terminals 72 may be offset from the first terminals 70 such that one or more of the second terminals 72 are aligned with respective Y-direction gaps between adjacent first terminals 70, even if the second terminals 72 are not directly between first terminals 70.

With embodiments, such as generally illustrated in FIGS. 5C and 7-10, third terminals 74 may include, for example, a stepped and/or planar configuration. For example and without limitation, third terminals 74 may be substantially planar and may be disposed substantially parallel to an X-Y plane and/or to the circuit board 24, such as when connected to terminals 70, 72. Additionally or alternatively, third terminals 74 may include a first portion 150 and a second portion 152 that may be offset from the first portion 150, such as in a Y-direction, which may provide a stepped configuration. The first portions 150 may be configured to extend into prongs 94, 104 of first and second terminals 70, 72, and/or the second portions 152 may be configured to extend into and/or at least partially through a first connector portion 56 of the connector wall 36 (e.g., the third terminals 74 may be configured as male terminals). A stepped configuration of the third terminals 74 may, for example, be configured to convert a staggered layout of first and second terminals 70, 72 into a parallel layout for connection with an external electrical connector 52. The second portion 152 may, for example, be disposed in parallel rows and parallel columns.

Figure 3:
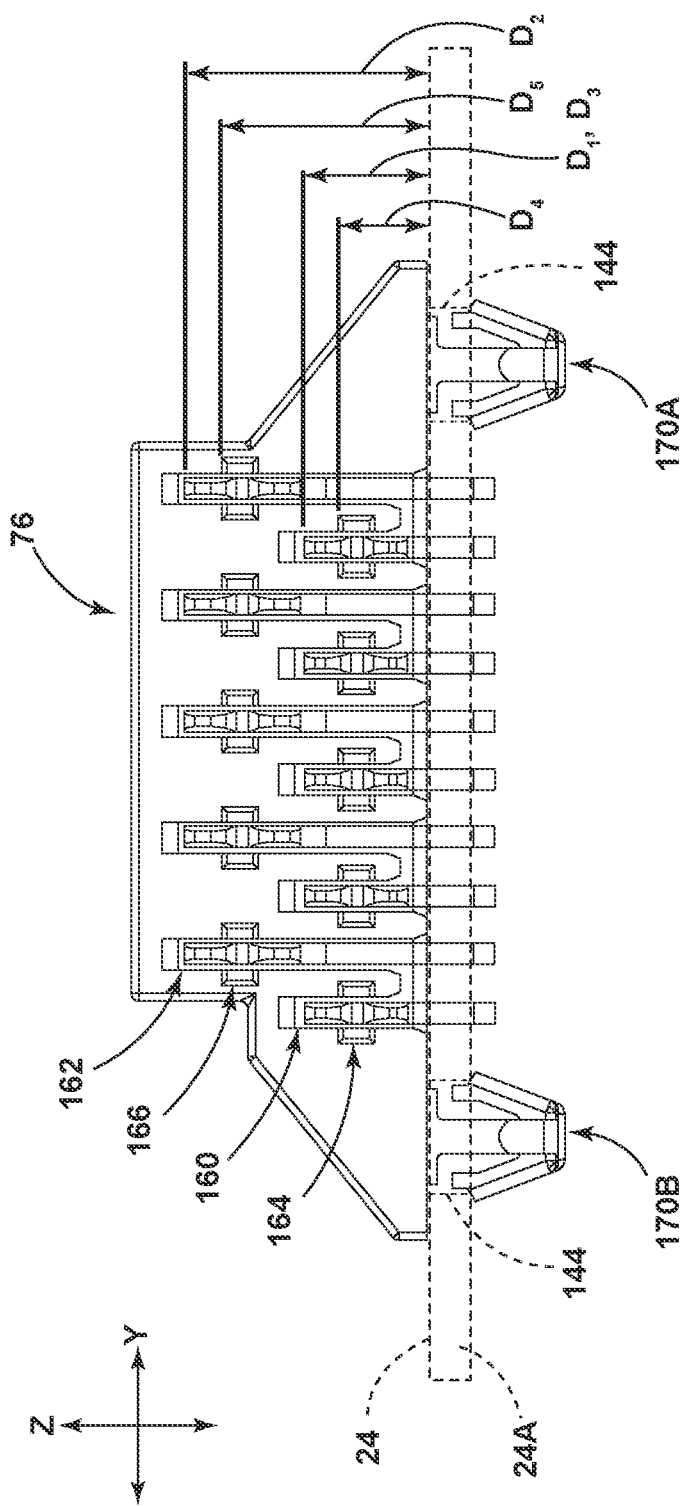
FIG. 3 is a side view generally illustrating embodiments of a terminal housing, a circuit board, and terminals according to teachings of the present disclosure.
Figure 5B:
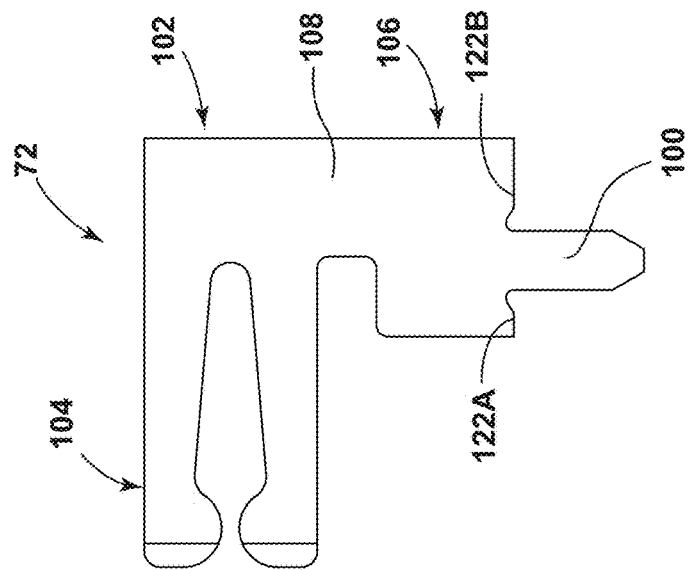
FIGS. 5A, 5B, and 5C are side views generally illustrating embodiments of terminals according to teachings of the present disclosure.
Figure 5A:
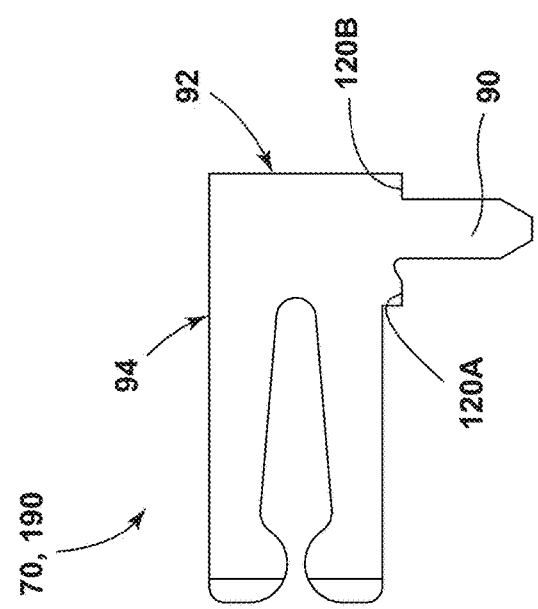
Figure 5C:
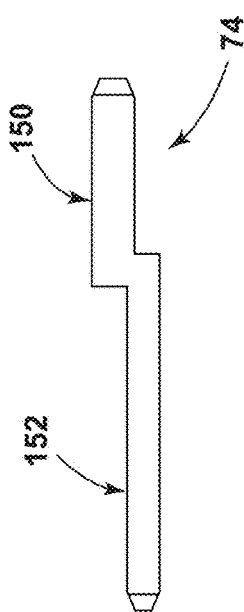

With embodiments, such as generally illustrated in FIG. 3, a first terminal housing 76 may include one or more recesses, such as a plurality of first recesses 160, a plurality of second recesses 162, a plurality of third recesses 164, and/or a plurality of fourth recesses 166. The plurality of first recesses 160 may be configured to at least partially receive the plurality of first terminals 70. For example and without limitation, the plurality of first recesses 160 may include a first recess 160 aligned with each first terminal 70 and/or may extend up from a bottom of the first terminal housing 76 generally parallel to the first terminals 70 and/or an X-Z plane. The heights of the first recesses 160 (e.g., in a Z-direction) may be at least as great as the height of the first terminals 70 above the circuit board 24 when connected to the circuit board 24. The plurality of second recesses 162 may include a second recess 162 aligned with each second terminal 72 and/or may extend up from a bottom of the first terminal housing 76 generally parallel to the second terminals 72 and/or an X-Z plane. The heights of the second recesses 162 (e.g., in a Z-direction) may be at least as great as the height of the second terminals 72 above the circuit board 24 when connected to the circuit board 24. For example and without limitation, the first recesses 160 and the second recesses 162 may be substantially parallel to each other and/or may be disposed in an alternating configuration that may correspond to an alternating configuration of the first and second terminals 70, 72. The second recesses 162 may be taller than the first recesses 160. Recesses 160, 162 may be configured to facilitate proper positioning of terminals 70, 72 for (and prior to) connection with third terminals 74.

In embodiments, the plurality of third recesses 164 may include a third recess 164 for each third terminal 74 that connects with a first terminal 70 (e.g., for each of third terminals $74_{1-5}$). The third recesses 164 may extend substantially parallel with the circuit board 24 and/or an X-Y plane. The third recesses 164 may intersect (e.g., perpendicularly) respective first recesses 160 and/or may be aligned (e.g., in a Z-direction) with a middle of the prongs 94 of the first terminals 70 and/or about the middle of the first recesses 160. The plurality of fourth recesses 166 may include a fourth recess 166 for each third terminal 74 that connects with a second terminal 72 (e.g., for each of third terminals $74_{6-10}$). The fourth recesses 166 may extend substantially parallel with the circuit board 24 and/or an X-Y plane. The fourth recesses 176 may intersect (e.g., perpendicularly) respective second recesses 162 and/or may be aligned (e.g., in a Z-direction) with a middle of the prongs 104 of the second terminals 72. The third recesses 164 may be disposed at a distance D4 from the circuit board 24 and the fourth recesses 166 may be disposed at a distance D5 from the circuit board 24 that may be greater than distance D4. The third recesses 164 and/or the fourth recesses 166 may be tapered or chamfered, such as to facilitate insertion of the third terminals 74 into the first terminals 70 and the second terminals 72, respectively, and/or into the first terminal housing 76. Recesses 164, 166 may be configured to facilitate proper insertion of third terminals 74 into the terminals 70, 72, which may facilitate a proper electrical connection between the third terminals 74 and the terminals 70, 72.

With embodiments, the first terminals 70 and the second terminals 72 may be inserted into apertures 140, 142 of the circuit board 24 (e.g., in a Z-direction) and may be fixed therein, such as via soldering and/or a press-fit connection. The first terminal housing 76 may be disposed over the first and second terminals 70, 72 (e.g., from a Z-direction), such as until housing tabs 170A, 170B are inserted into and/or snap into third apertures 144 of the circuit board 24, which may connect the first terminal housing 76 with the circuit board 24. The side wall 30 may be disposed at least partially around the circuit board 24, such as after the first terminal housing 76 is connected to the circuit board 24. The side wall 30 may be disposed such that a first side wall aperture 180 of the first portion 30A is at least partially aligned with the first terminal housing 76 and/or such that a second side wall aperture 182 of the first portion 30A is at least partially aligned with a second terminal housing 78 (see, e.g., FIG. 8). The third terminals 74 may be inserted through the first side wall aperture 180, such as into the first and second terminals 70, 72 and/or corresponding third and fourth recesses 164, 166 of the first terminal housing 76.

Figure 9:
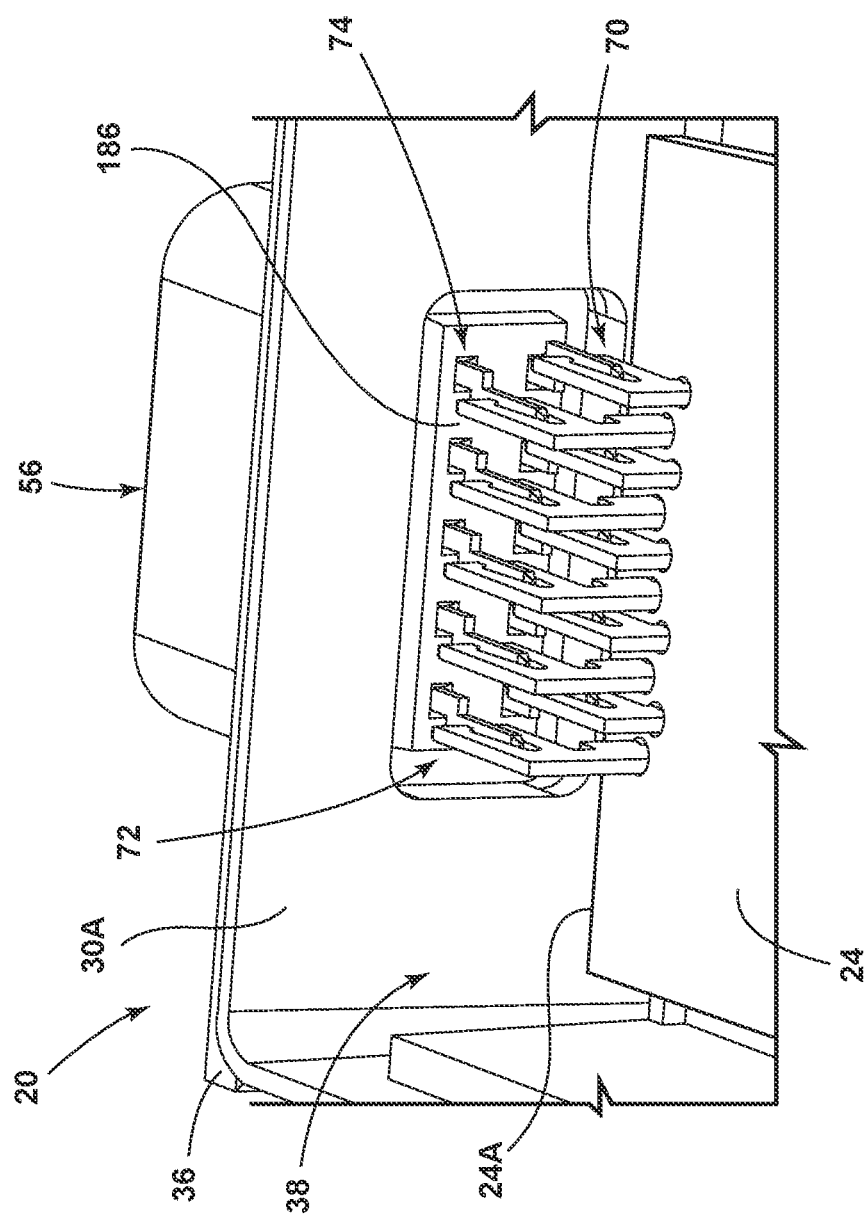
Figure 10:
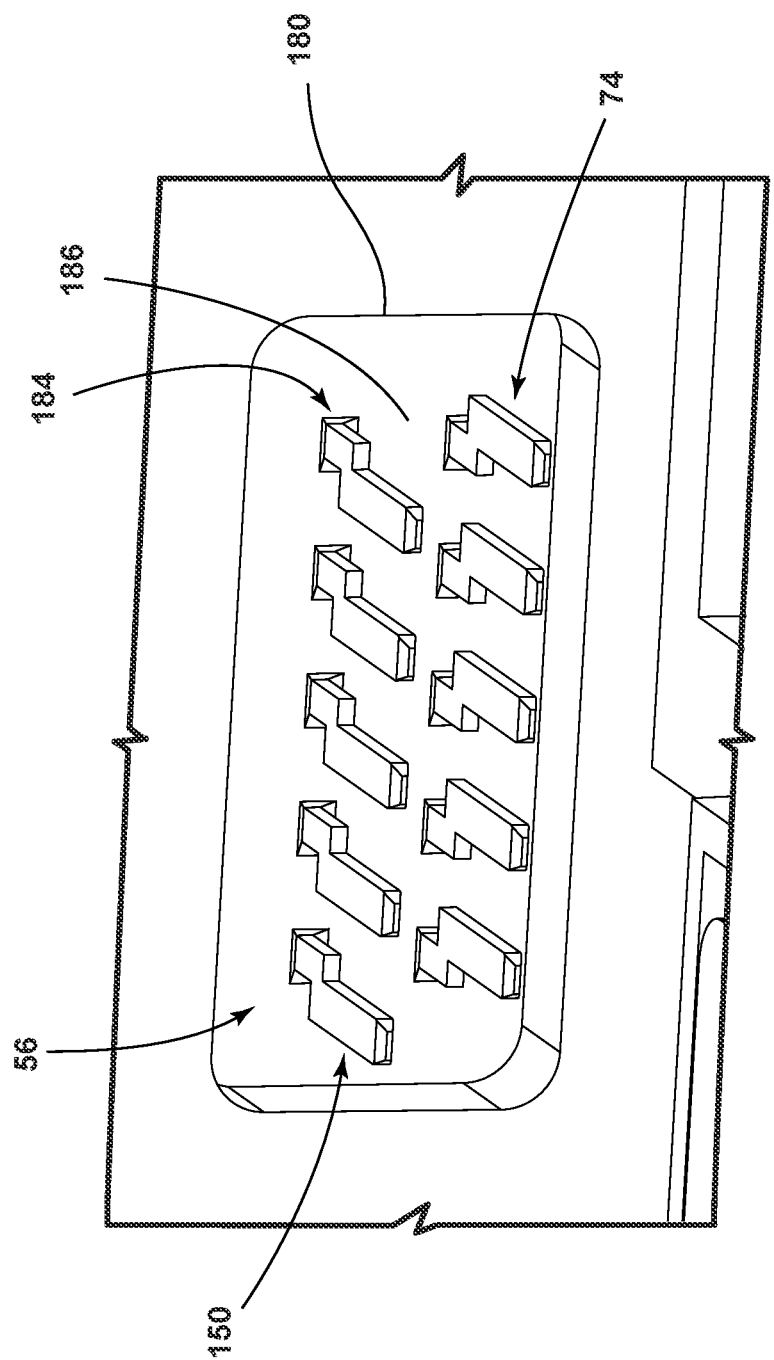
Figure 11:
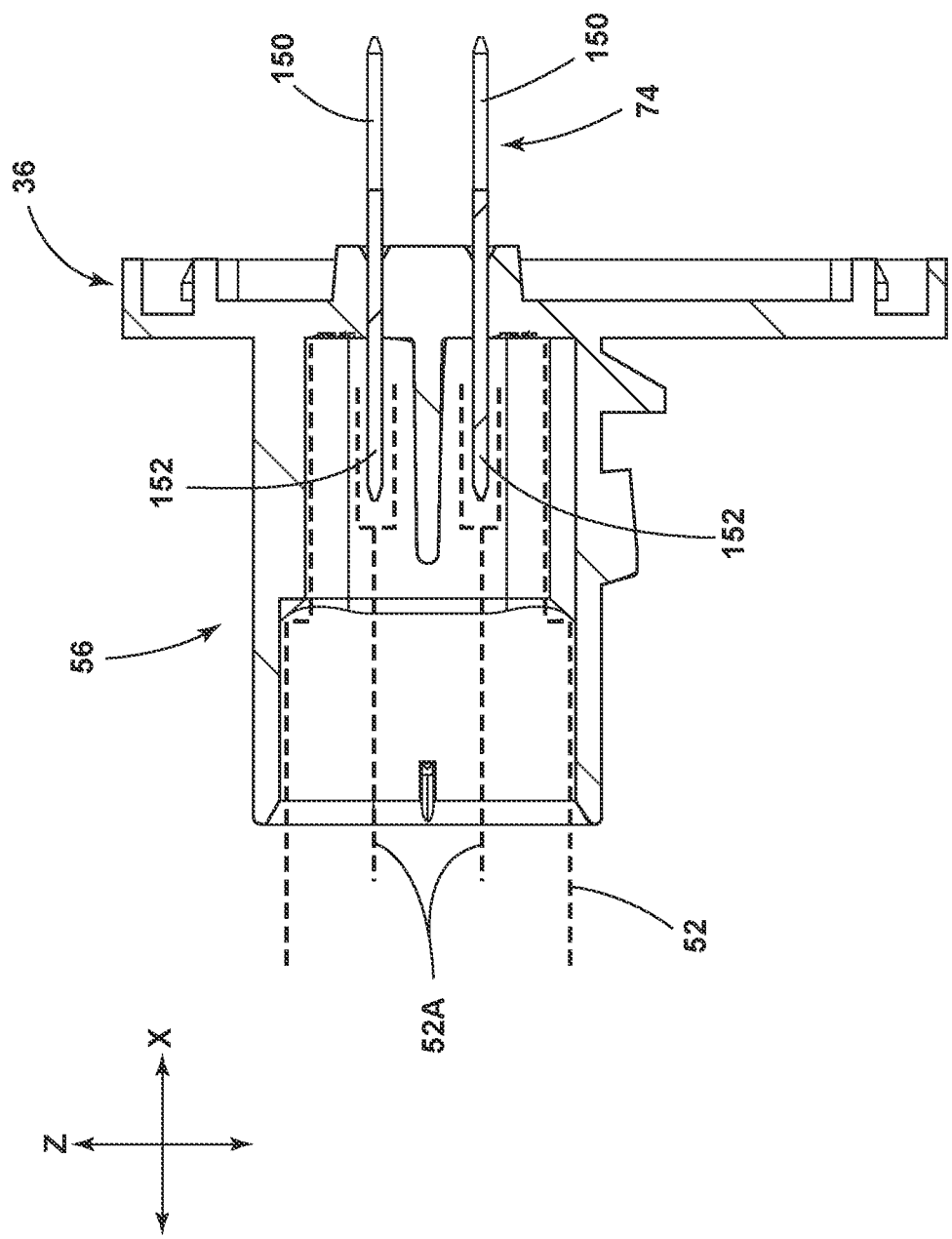
FIG. 11 is a cross-sectional view generally illustrating portions of an embodiment of an electrical unit according to teachings of the present disclosure.

In embodiments, such as generally illustrated in FIGS. 9 and 10, the connector wall 36 may then be moved proximate the first portion 30A of the side wall 30 such that the third terminals 74 are inserted into terminal apertures 184 of an inner wall 186 of the first connector portion 56. The third terminals 74 may extend through the inner wall 186 for connection with connector terminals 52A of the first connector 52 (see, e.g., FIG. 11).

In some configurations, the third terminals 74 may be inserted (e.g., pressed, molded, fixed, etc.) into terminal apertures 184 of an inner wall 186 of the first connector portion 56 before being inserted into the first and second terminals 70, 72 and/or corresponding third and fourth recesses 164, 166 of the first terminal housing 76. Then, moving the connector wall 36 proximate the first portion 30A of the side wall 30 may include inserting the third terminals 74 into the first and second terminals 70, 72 and/or corresponding third and fourth recesses 164, 166 of the first terminal housing 76, which may be an at least partially blind connection process. Inserting the third terminals 74 into terminal apertures 184 before insertion into first and second terminals 70, 72 may facilitate proper alignment of the third terminals 74 for connection with the terminals 52A of the electrical connector 52. Additionally or alternatively, inserting third terminals 74 into first and second terminals 70, 72 prior to connecting the third terminals with the connector wall 36 may involve increasing the dimensions of apertures 184, which may (i) allow for movement of the third terminals 74, (ii) create additional tolerances, and/or (iii) create areas for additional fluid sealing.

Referring again to FIGS. 7-9, in embodiments, a first one 74₁ of the third terminals 74 may be inserted into a first one 70₁ of the first terminals 70 and a second one 74₂ of the third terminals 74 may be inserted into a first one 72₁ of the second terminals 72. The first portion 150₁ of third terminal 74₁ may be inserted into first terminal 70₁ and may be offset from the first portion 150₂ of third terminal 74₂ in two directions, such as a Y-direction and a Z-direction. The second portion 152₁ of third terminal 74₁ and the second portion 152₂ of third terminal 74₂ may be offset from each other in one direction, such as Z-direction, and/or may be substantially aligned with each other in an X-direction and a Y-direction, which may result in the second portion 152₂ of third terminal 74₂ to be disposed substantially directly above the second portion 152₁ of third terminal 74₁ (e.g., third terminals 74₁, 74₂ may be disposed in a stacked and mirrored configuration). An electrical unit 20 may include a plurality of pairs of mirrored and stacked third terminals 74 that may each connect with a respective pairing of a first terminal 70 and a second terminal 72.

Figure 12:
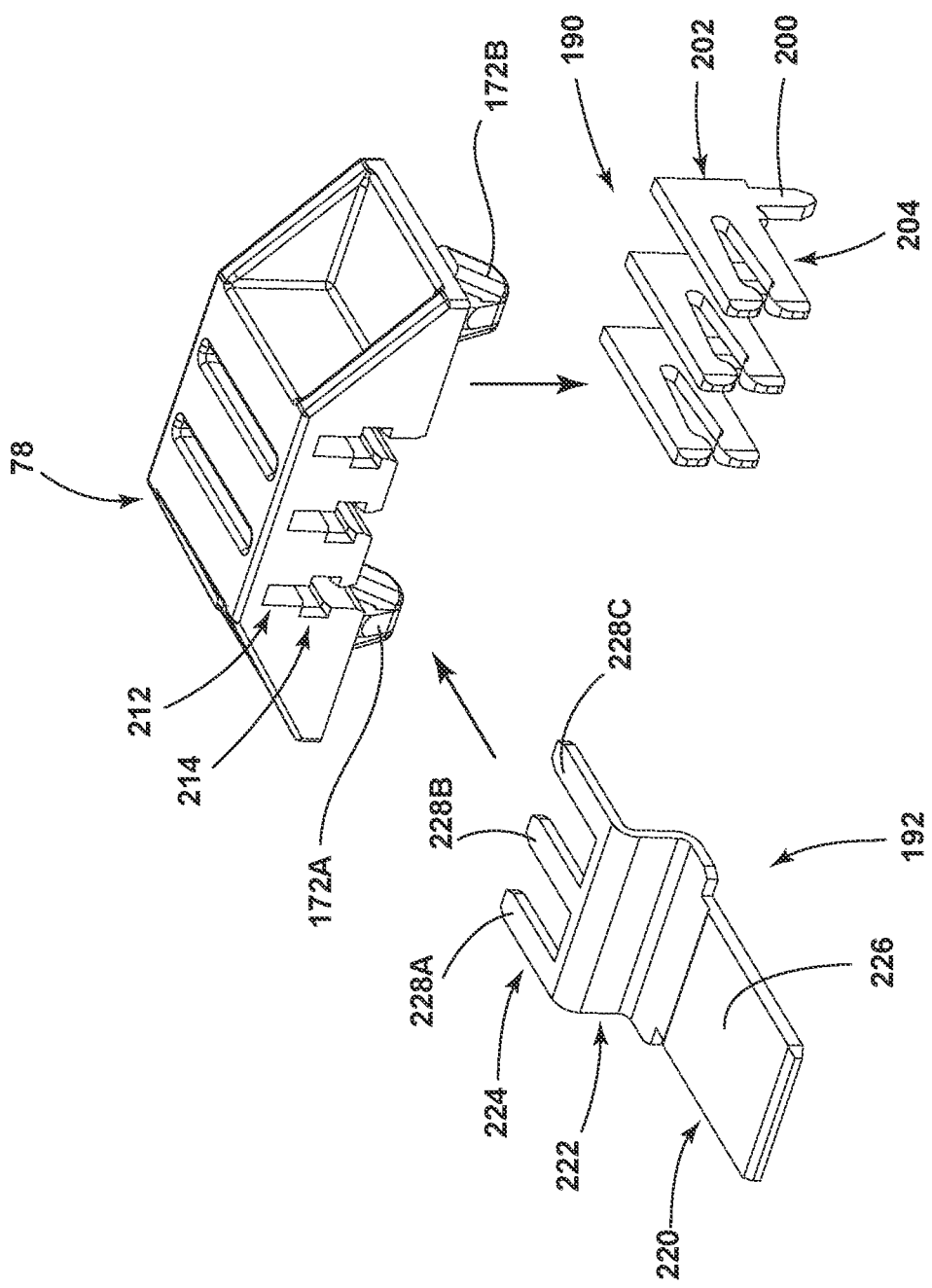
FIG. 12 is an exploded perspective view generally illustrating embodiments of a terminal housing and terminals according to teachings of the present disclosure.
Figure 13:
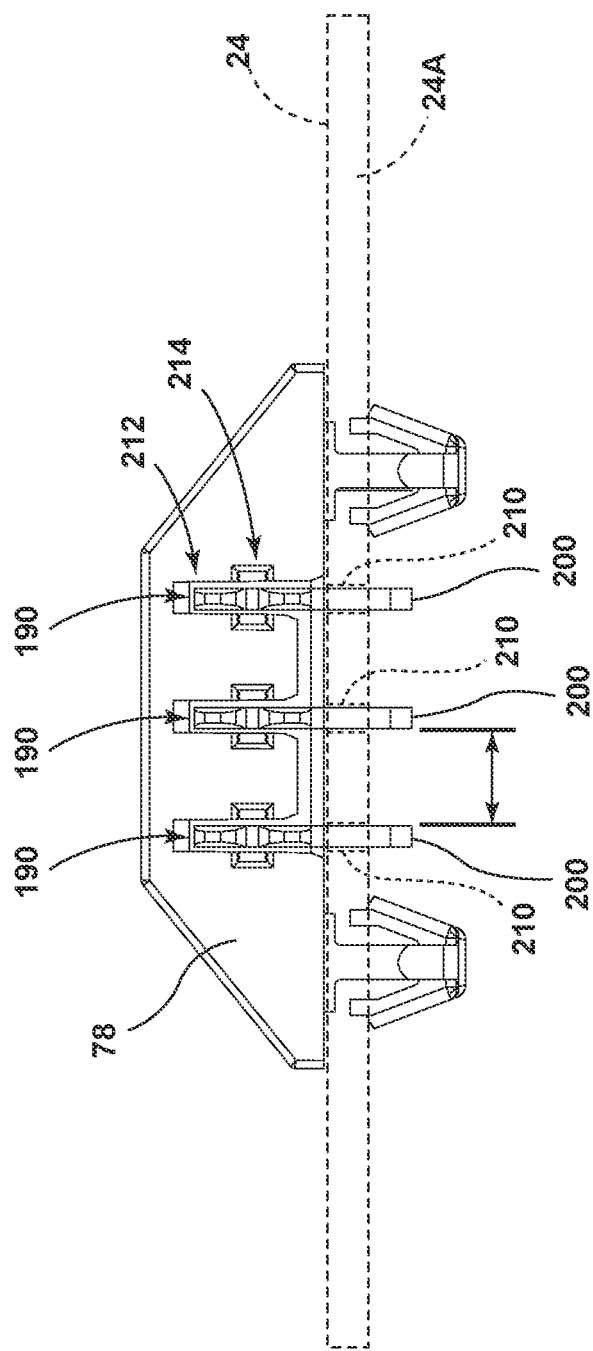
FIG. 13 is a side view generally illustrating embodiments of a terminal housing, a circuit board, and terminals according to teachings of the present disclosure.

In embodiments, such as generally illustrated in FIGS. 12 and 13, an electrical unit 20 may include one or more fourth terminals 190 that may be connected to the circuit board 24, and/or a fifth terminal 192 that may be connected with the one or more fourth terminals 190. The fourth terminals 190 may, for example, include the same or a similar configuration as the first terminals 70, and may include tabs 200 and/or mating portions 202 that may include prongs 204. The tabs 200 may be inserted into and/or soldered in fourth apertures 210 of the circuit board 24. The prongs 204 may extend toward the edge 24A of the circuit board 24 substantially parallel to an X-Z plane. The fourth terminals 190 may be substantially planar and may, for example be spaced from each other by about 4 mm to about 5 mm, such as about 4.5 mm. The fourth terminals 190 may be spaced farther apart than the first and second terminals 70, 72, as higher currents may be provided to the fifth terminal 192 than the third terminals 74. For example, the fifth terminal 192 may be configured as a power terminal (e.g., for supplying the electrical unit 20 with electrical power) and the third terminals 74 may be configured as data terminals. The fourth terminals 190 may be aligned with each other in a row/column, such as to at least partially receive the fifth terminal 192. Multiple fourth terminals 190 may, for example, connect to the same fifth connector 192 to distribute a relatively high current from the fifth terminal 192.

With embodiments, a second terminal housing 78 may include one or more first recesses 212, such as for each fourth terminal 190. The first recesses 212 may, for example and without limitation, be configured in the same or a similar manner as the first recesses 160 of the first terminal housing 76. For example, the first recesses 212 may extend upward from a bottom of the second terminal housing 78, such as generally parallel with a X-Z plane. The second terminal housing 78 may include one or more second recesses 214, such as for each fourth terminal 190. The second recesses 214 may, for example and without limitation, include the same or a similar configuration as the third recesses 164 of the first terminal housing 76. For example, the second recesses 214 may be substantially parallel with an X-Y plane and/or may be substantially aligned with a middle of the prongs 196 (e.g., in a Z-direction). The second terminal housing 78 may be disposed over the fourth terminals 190, such as until one or more housing tabs 172A, 172B snap into the circuit board 24.

Figure 15:
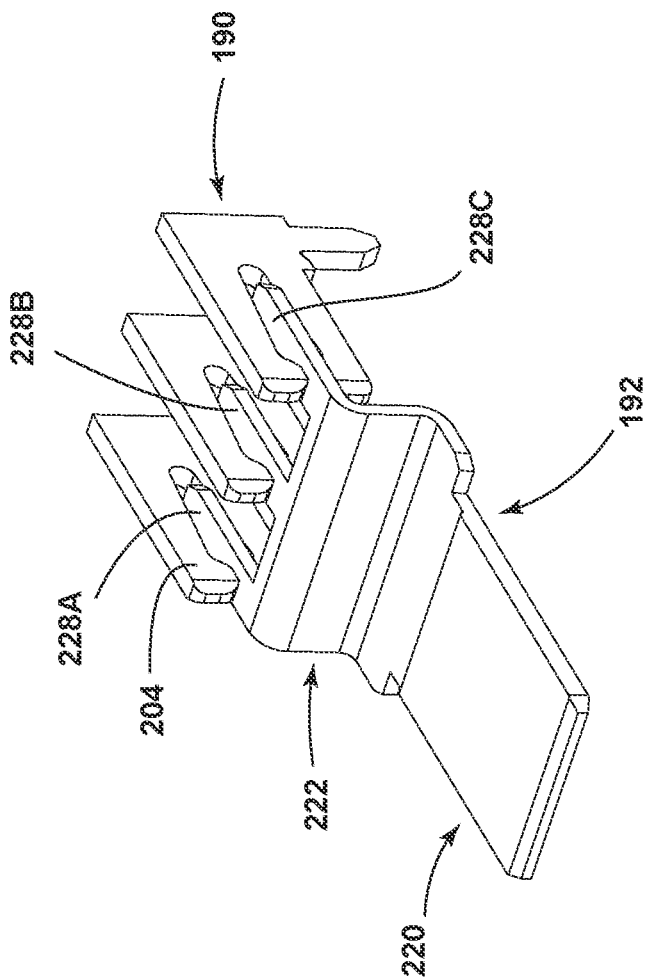
FIG. 15 is a perspective view generally illustrating embodiments of terminals according to teachings of the present disclosure.
Figure 16:
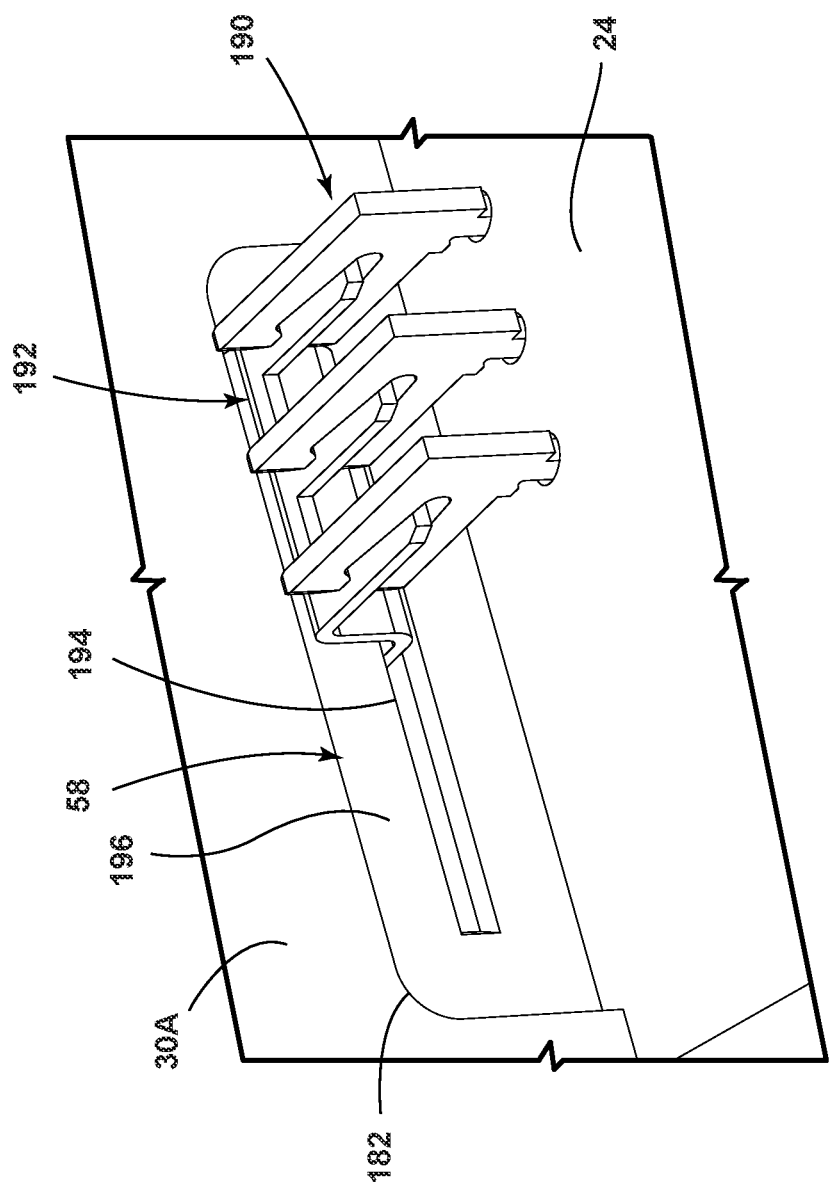
FIGS. 16 and 17 are perspective views generally illustrating portions of embodiments of electrical units according to teachings of the present disclosure.

In embodiments, such as generally illustrated in FIGS. 14A and 14B, a fifth terminal 192 may include a first portion 220, a second portion 222, and/or a third portion 224 that may, for example, be disposed in a stepped and/or generally S-shaped configuration. The first portion 220 may be substantially parallel with the third portion 224. The second portion 222 may be substantially perpendicular to the first portion 220 and/or the third portion 224. The second portion 222 may connect the first portion 220 with the third portion 224. The first portion 220 may include a section of increased thickness 226, which may be configured for use with a mating terminal configured for high electrical currents. The third portion 224 may include a plurality of protrusions 228, such as a first protrusion 228A, a second protrusion 228B, and/or a third protrusion 228C that may be configured for insertion into and/or connection with the fourth terminals 190. For example and without limitation, in an assembled configuration, such as generally illustrated in FIGS. 15 and 16, the protrusions 228 may be substantially parallel with an X-Y plane (e.g., substantially perpendicular to the fourth terminals 190) and may be inserted into respective prongs 204, such as to electrically connect the fifth terminal 192 with the fourth terminals 190 and/or the circuit board 24. In some circumstances, the first portion 220 of a fifth terminal 192 may be at least partially coplanar with the circuit board 24 (see, e.g., FIG. 8).

In embodiments, a fifth terminal 192 may be inserted into one or more fourth terminals 190 and/or the second terminal housing 78, and the connector wall 36 may then be moved proximate the first portion 30A of the side wall 30 such that the fifth terminal 192 is inserted into a terminal aperture or apertures 194 of an inner wall 196 of the second connector portion 58. The fifth terminal 192 may extend through the inner wall 196 for connection with connector terminals 54A of the second connector 54. For example and without limitation, moving the connector wall 36 proximate the first portion 30A of the side wall 30 may include inserting third terminals 74 into the first connector portion 56, and may include inserting a fifth terminal 192 into the second connector portion 58 (e.g., substantially simultaneously).

In some configurations, a fifth terminal 192 may be inserted into a terminal aperture or apertures 194 of an inner wall 196 of the second connector portion 58 before being inserted into the fourth terminals 190 and/or corresponding recesses 214 of the second terminal housing 78. Then, moving the connector wall 36 proximate the first portion 30A of the side wall 30 may include inserting the fifth terminal 192 into the fourth terminals 190 and/or corresponding second recesses 214 of the second terminal housing 78, which may be an at least partially blind connection process. For example and without limitation, moving the connector wall 36 proximate the first portion 30A of the side wall 30 may include inserting third terminals 74 into first and second terminals 70, 72, and may include inserting a fifth terminal 192 into the fourth terminals 190 (e.g., substantially simultaneously).

In embodiments, second recesses 214 may be tapered or chamfered, such as to facilitate insertion of a fifth terminal 192 into the fourth terminals 190 and/or into the second terminal housing 78.

Figure 17:
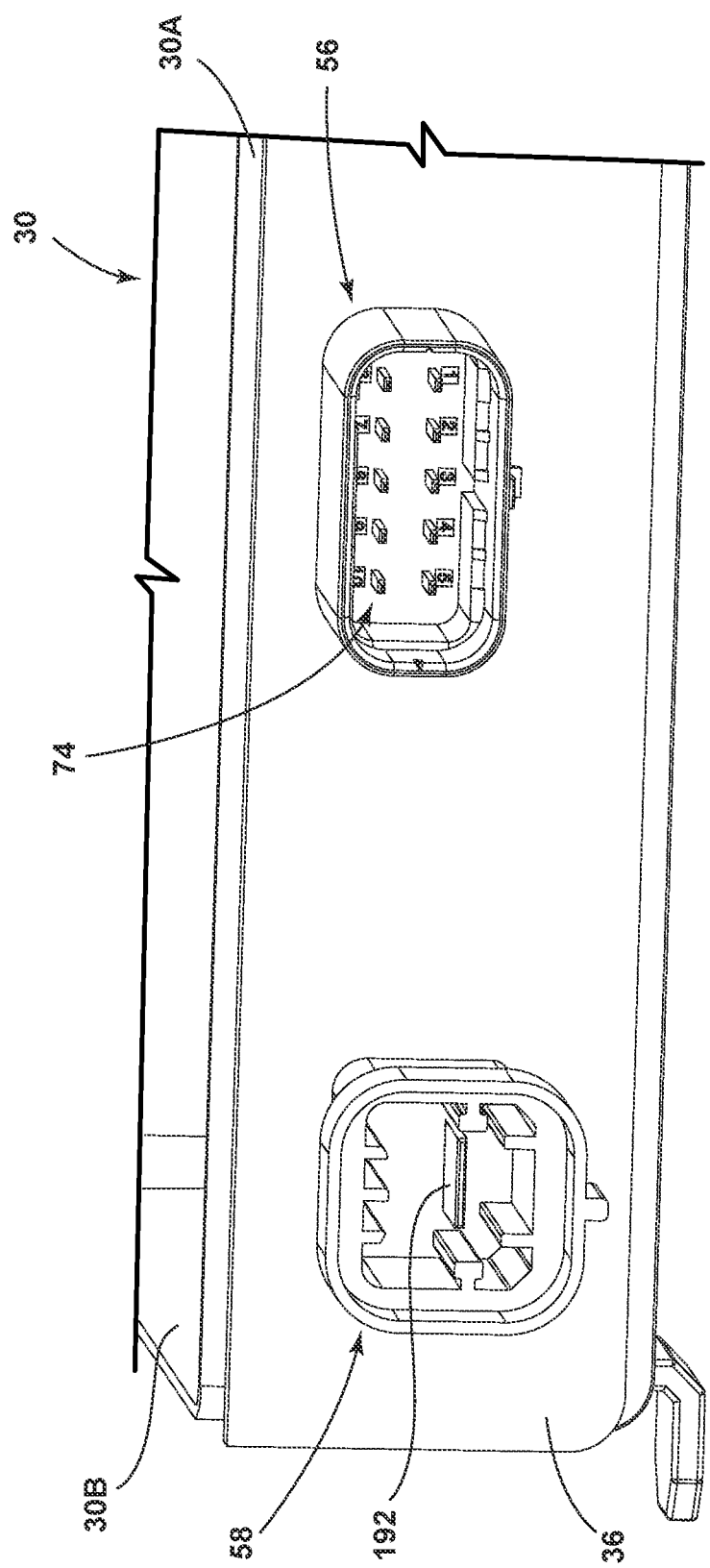

With embodiments, such as generally illustrated in FIG. 17, in an assembled configuration, one or more third terminals 74 may extend out from a connector wall 36, such as at least partially in a first connection portion 56, and/or a fifth terminal 192 may extend out from a connector wall 36, such as least partially in a second connection portion 58.

Figure 18:
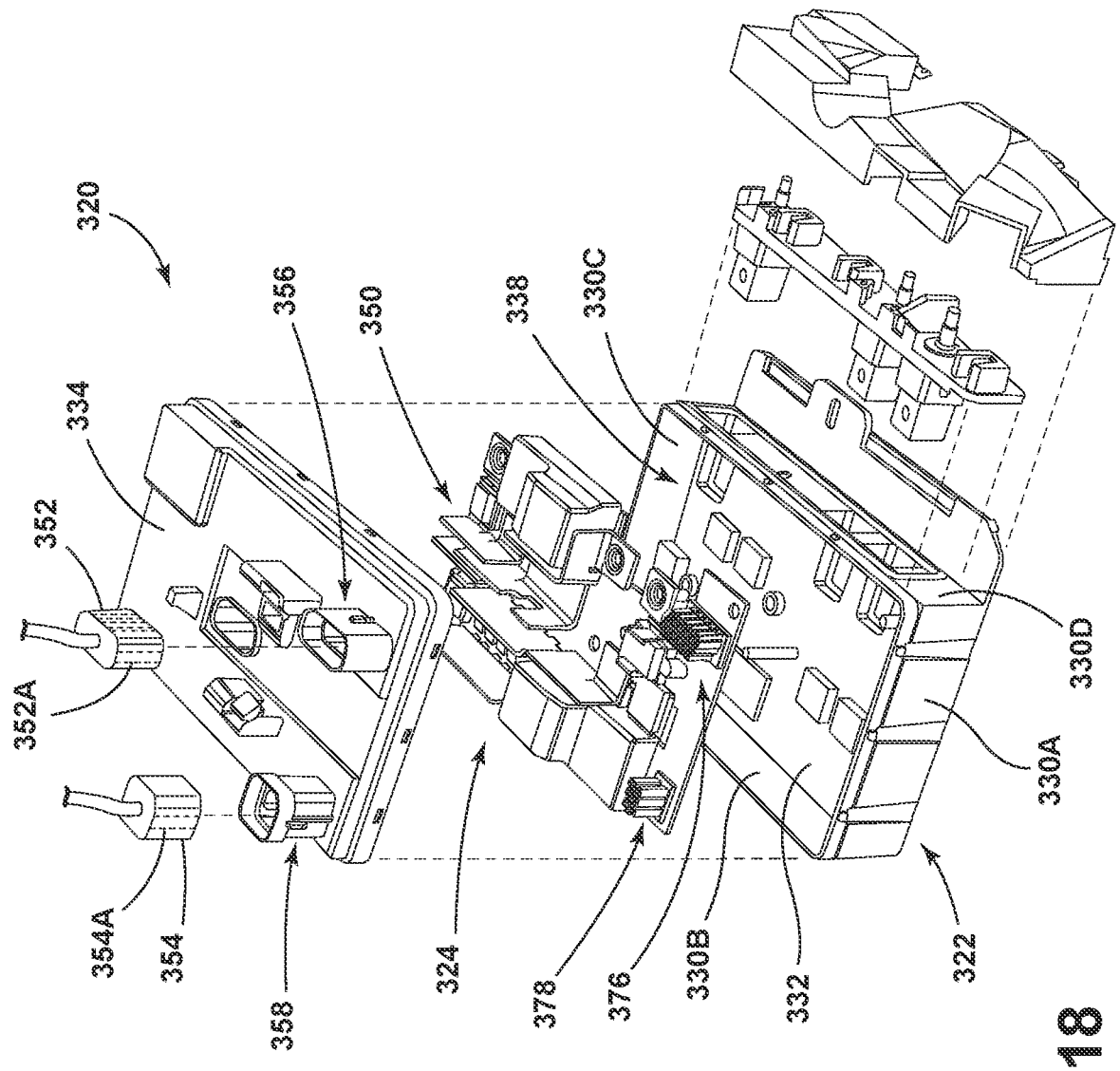
FIG. 18 is an exploded perspective view generally illustrating an embodiment of an electrical unit according to teachings of the present disclosure.

In embodiments, such as generally illustrated in FIG. 18, an electrical unit 320 may include an electrical unit housing 322 and/or a circuit board 324 that may be disposed at least partially in the electrical unit housing 322. The electrical unit housing 322 may include a side wall 330, a lower cover 332, and/or an upper cover 334. The side wall 330 may include a first portion 330A, a second portion 330B, a third portion 330C, and/or a fourth portion 330D that may be disposed in a rectangular configuration and may extend between the lower cover 332 and the upper cover 334 to provide an inner space 338 in which the circuit board 324 may be at least partially disposed. The lower cover 332 and/or the upper cover 334 may, in embodiments, be integrally formed with one or more portions of the side wall 330. The lower cover 332 and/or the upper cover 334 may, for example, be substantially parallel to an X-Y plane and/or the circuit board 324, and/or may be substantially perpendicular to a Z-direction. The upper cover 334 may, for example and without limitation, include an electrically insulating material, such as a plastic/polymer, and may be connected (e.g., glued) to the side wall 330, such as in a fluid sealed manner. The side wall 330 and the lower cover 332, which may be integrally formed, may include a thermally conductive material, such as aluminum, which may facilitate heat dissipation.

With embodiments, one or more electrical components 350 may be connected to the circuit board 324. The one or more electrical components 350 may, for example and without limitation, include relays, controllers, fuses, capacitors, resistors, and/or inductors, among others. The circuit board 324 may, for example, be substantially parallel to an X-Y plane and/or substantially perpendicular to a Z-direction. A first terminal housing 376 and/or a second terminal housing 378 may be connected (e.g., mechanically) to the circuit board 324.

In embodiments, an electrical unit 320 may be configured for connection with one or more external electrical connectors, such as a first external connector 352 and/or a second external connector 354. The upper cover 334 (or the lower cover 332) may include a first connector portion 356 configured for connection with the first external connector 352 and/or may include a second connector portion 358 configured for connection with the second external connector 354. The upper cover 334 may, for example, be configured as, function as, include, and/or be referred to as a connector wall. The electrical unit 320 may include a plurality of terminals configured to provide an electrical connection between the external connectors 352, 354 and the circuit board 324 and/or electrical components 350 connected thereto. For example and without limitation, an electrical unit 320 may include a plurality of first terminals 370 (e.g., first terminals $370_{1-5}$), a plurality of second terminals 372 (e.g., second terminals $372_{1-5}$), and/or a plurality of third terminals 374 (e.g., third terminals $374_{1-10}$), some or all of which may be disposed at least partially in a first terminal housing 376 (see, e.g., FIG. 19).

With embodiments, such as generally illustrated in FIGS. 19, 22, 25, and 27, the first terminals 370 may include a tab 390 extending generally downward (e.g., in a Z-direction) for connection with the circuit board 324 and a mating portion 392 extending generally upward for mating with respective third terminals 374. The mating portion 392 may include a pair of prongs 394 that may extend substantially parallel to the tab 390, such as in a Z-direction (e.g., first terminals 370 may be configured as female terminals). The second terminals 372 may include the same or a similar configuration as the first terminals 370. For example, the second terminals 372 may include a tab 400 extending generally downward for connection with the circuit board 324 and a mating portion 402 for mating with respective third terminals 374. The mating portion 402 may include a pair of prongs 404 that may extend substantially parallel to the tab 400, such as in a Z-direction (e.g., second terminals 372 may be configured as female terminals).

In embodiments, the first terminals 370 and the second terminals 372 may include contact portions 420A, 420B, 422A, 422B that may be configured to contact the circuit board 324 and/or limit insertion depth of the terminals 370, 372 into the circuit board 324.

In embodiments, the first terminals 370 and/or the second terminals 372 may be substantially planar. For example and without limitation, when connected to the circuit board 324, the first terminals 370 and the second terminals 372 may be substantially parallel to each other and/or a Y-Z plane.

With embodiments, such as generally illustrated in FIGS. 19, 21, 22, 29 and 30, the first terminals 370 and the second terminals 372 may be disposed in an alternating and/or staggered configuration. For example and without limitation, a second terminal 372 may be disposed at least partially between (e.g., in a Y-direction) pairs of first terminals 370 such that the terminals 370, 372 are disposed in a first-second-first-second alternating configuration. With an alternating and staggered configuration, tabs 390, 400 of first and second terminals 370, 372 may be offset in a first direction (e.g., an X-direction) and a second direction (e.g., a Y-direction), which may provide minimum clearances between the tabs 390, 400 and the prongs 394, 404 while minimizing a total footprint of the terminals 370, 372 and the first terminal housing 376 on the circuit board 324. One or more of the first terminals 370 may be aligned with gaps between the second terminals 372, and/or one or more second terminals 374 may be aligned with gaps between the first terminals 370.

With embodiments, such as generally illustrated in FIGS. 19, 21, 22, 23, and 24, third terminals 374 may include, for example, a stepped and/or planar configuration. For example and without limitation, third terminals 374 may be substantially planar and may be disposed substantially parallel to an X-Z plane and/or to the circuit board 324, such as when connected to terminals 370, 372. Additionally or alternatively, third terminals 374 may include a first portion 450 and a second portion 452 that may be offset from the first portion 450, such as in an X-direction, which may provide a stepped configuration. The first portions 450 may be configured to extend into prongs 394, 404 of first and second terminals 370, 372, and/or the second portions 452 may be configured to extend into and/or at least partially through a first connector portion 356 (e.g., the third terminals 374 may be configured as male terminals). A stepped configuration of the third terminals 374 may, for example, be configured to convert a staggered layout of first and second terminals 370, 372 into a parallel layout for connection with an external electrical connector 352. One or more third terminals 374 may be substantially perpendicular to the first terminals 370 and the second terminals 372.

Figure 28:
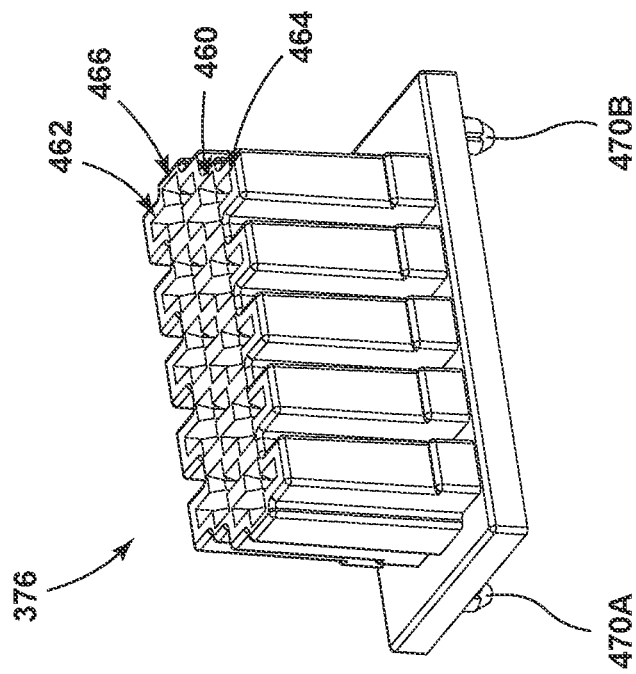
FIG. 28 is a perspective view generally illustrating embodiments of a terminal housing and a circuit board according to teachings of the present disclosure.

With embodiments, such as generally illustrated in FIG. 28, a first terminal housing 376 may include one or more recesses, such as a plurality of first recesses 460, a plurality of second recesses 462, a plurality of third recesses 464, and/or a plurality of fourth recesses 466. The plurality of first recesses 460 may be configured to at least partially receive the plurality of first terminals 370. For example and without limitation, the plurality of first recesses 460 may include a first recess 460 aligned with each first terminal 370 and/or may extend generally parallel to the first terminals 370 and/or a Y-Z plane. The plurality of second recesses 462 may include a second recess 462 aligned with each second terminal 372 and/or may extend up from a bottom of the first terminal housing 376 generally parallel to the second terminals 372 and/or a Y-Z plane. The first recesses 460 and the second recesses 462 may be substantially parallel to each other and/or may be disposed in an alternating configuration that may correspond to an alternating configuration of the first and second terminals 370, 372.

In embodiments, the plurality of third recesses 464 may include a third recess 464 for each third terminal 374 that connects with a first terminal 370 (e.g., for each of third terminals $374_{1-5}$). The third recesses 464 may extend substantially parallel with an X-Z plane. The third recesses 464 may intersect (e.g., perpendicularly) respective first recesses 460 and/or may be aligned (e.g., in a Y-direction) with a middle of the prongs 394 of the first terminals 370 and/or about the middle of the first recesses 460. The plurality of fourth recesses 466 may include a fourth recess 466 for each third terminal 374 that connects with a second terminal 372 (e.g., for each of third terminals $374_{6-10}$). The fourth recesses 466 may extend substantially parallel with the circuit board 324 and/or an X-Z plane. The fourth recesses 476 may intersect (e.g., perpendicularly) respective second recesses 462 and/or may be aligned (e.g., in a Y-direction) with a middle of the prongs 404 of the second terminals 372. The third recesses 464 and/or the fourth recesses 466 may be tapered or chamfered, such as to facilitate insertion of the third terminals 374 into the first terminals 370 and the second terminals 372, respectively, and/or into the first terminal housing 376. Recesses 460, 462 may be configured to facilitate proper positioning of terminals 370, 372 for (and prior to) connection with third terminals 374.

With embodiments, the first terminals 370 and the second terminals 372 may be inserted into apertures 440, 442 of the circuit board 324 (e.g., in a Z-direction) and may be fixed therein, such as via soldering and/or a press-fit connection. The first terminal housing 376 may be disposed over the first and second terminals 370, 372 (e.g., from a Z-direction) until housing tabs 470A, 470B are inserted into and/or snap into third apertures 444 of the circuit board 324, which may connect the first terminal housing 376 with the circuit board 324. The third terminals 374 may be inserted into the first and second terminals 370, 372 and/or corresponding third and fourth recesses 464, 466 of the first terminal housing 376.

Figure 27:
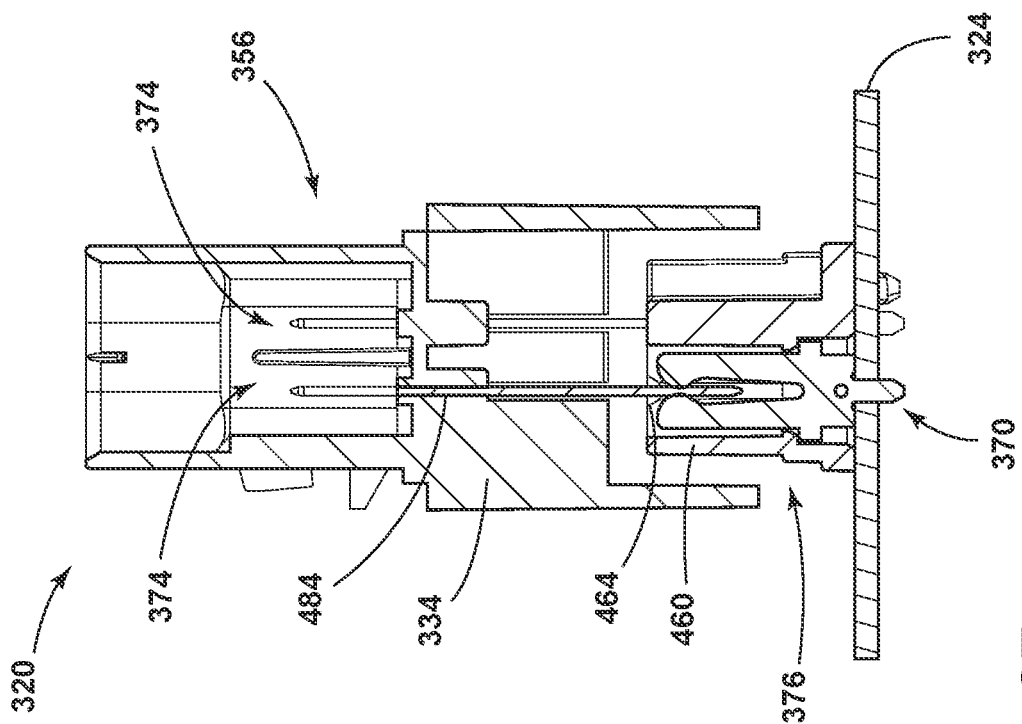
FIG. 27 is a cross-sectional view generally illustrating portions of an embodiment of an electrical unit according to teachings of the present disclosure
Figure 30:
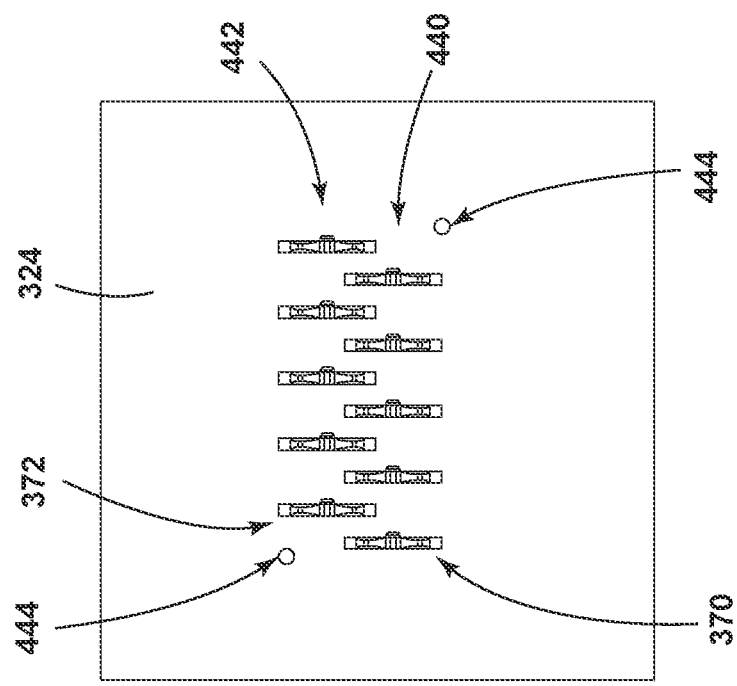
FIG. 30 is a top view generally illustrating embodiments of a circuit board and terminals according to teachings of the present disclosure.
Figure 29:
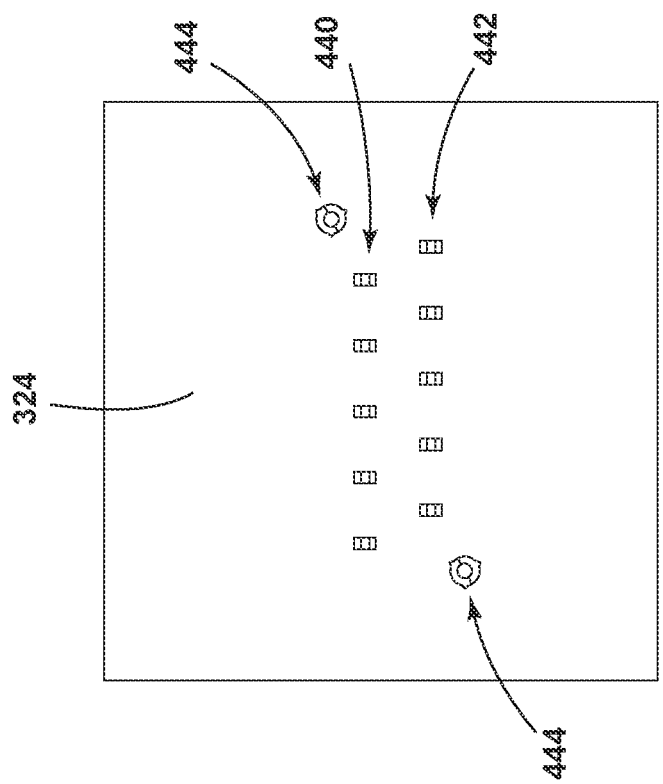
FIG. 29 is a bottom view generally illustrating an embodiment of a circuit board according to teachings of the present disclosure.
Figure 32:
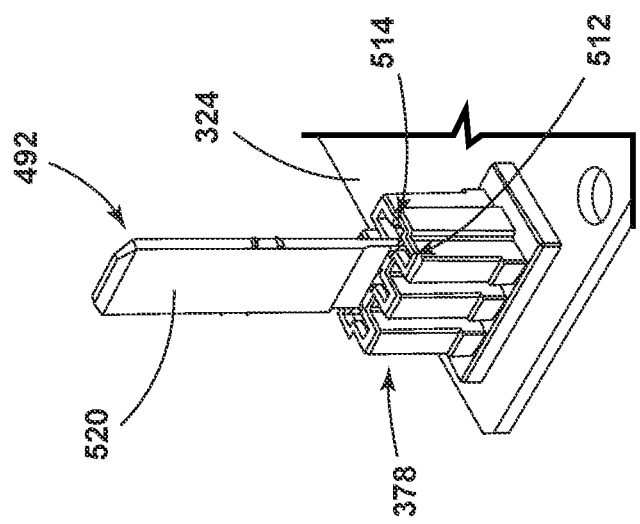
FIG. 32 is a perspective view generally illustrating embodiments of a terminal housing, a circuit board, and a terminal according to teachings of the present disclosure.
Figure 31:
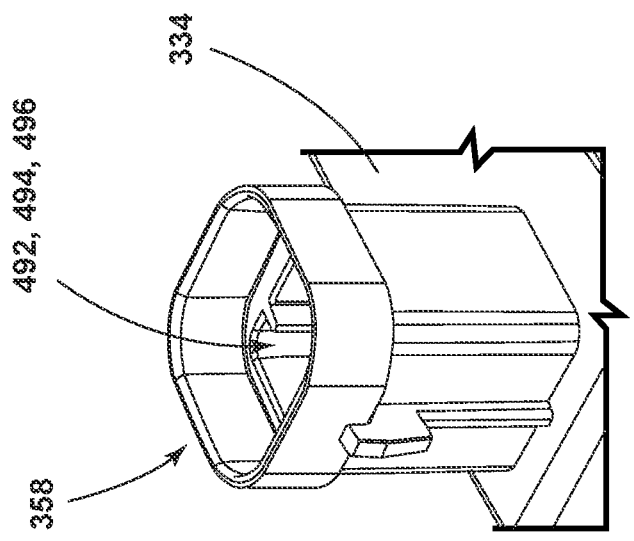
FIG. 31 is a perspective view generally illustrating an embodiment of a connector portion according to teachings of the present disclosure.

In embodiments, such as generally illustrated in FIGS. 23 and 27, the upper cover 334 may then be moved toward the circuit board 324 such that the third terminals 374 are inserted into terminal apertures 484 of an inner wall 486 of the first connector portion 456. The third terminals 374 may extend through the inner wall 486 for connection with connector terminals 352A of the first connector 352. In some configurations, the third terminals 374 may be inserted into terminal apertures 484 of an inner wall 486 of the first connector portion 356 before being inserted into the first and second terminals 370, 372 and/or corresponding third and fourth recesses 464, 466 of the first terminal housing 376. Then, moving the upper cover 334 toward the circuit board 324 may include inserting the third terminals 374 into the first and second terminals 370, 372 and/or corresponding third and fourth recesses 464, 466 of the first terminal housing 376, which may be an at least partially blind connection process (e.g., the upper cover 334 may block at least some views during connection).

In embodiments, a first one $374_1$ of the third terminals 374 may be inserted into a first one $370_1$ of the first terminals 370, and a second one $374_2$ of the third terminals 374 may be inserted into a first one $372_1$ of the second terminals 372. The first portion $450_1$ of a third terminal $374_1$ may be inserted into the first terminal $370_1$ and may be offset from the first portion $450_2$ of third terminal $374_2$ in two directions, such as an X-direction and a Y-direction. The second portion $452_1$ of third terminal $374_1$ and the second portion $452_2$ of third terminal $374_2$ may be offset from each other in one direction, such as X-direction, and/or may be substantially aligned with each other in a Y-direction and a Z-direction (e.g., third terminals $374_1$, $374_2$ may be disposed in a stacked and mirrored configuration). An electrical unit 320 may include a plurality of pairs of mirrored and stacked third terminals 374 that may each connect with a respective pairing of a first terminal 370 and a second terminal 372.

Figure 19:
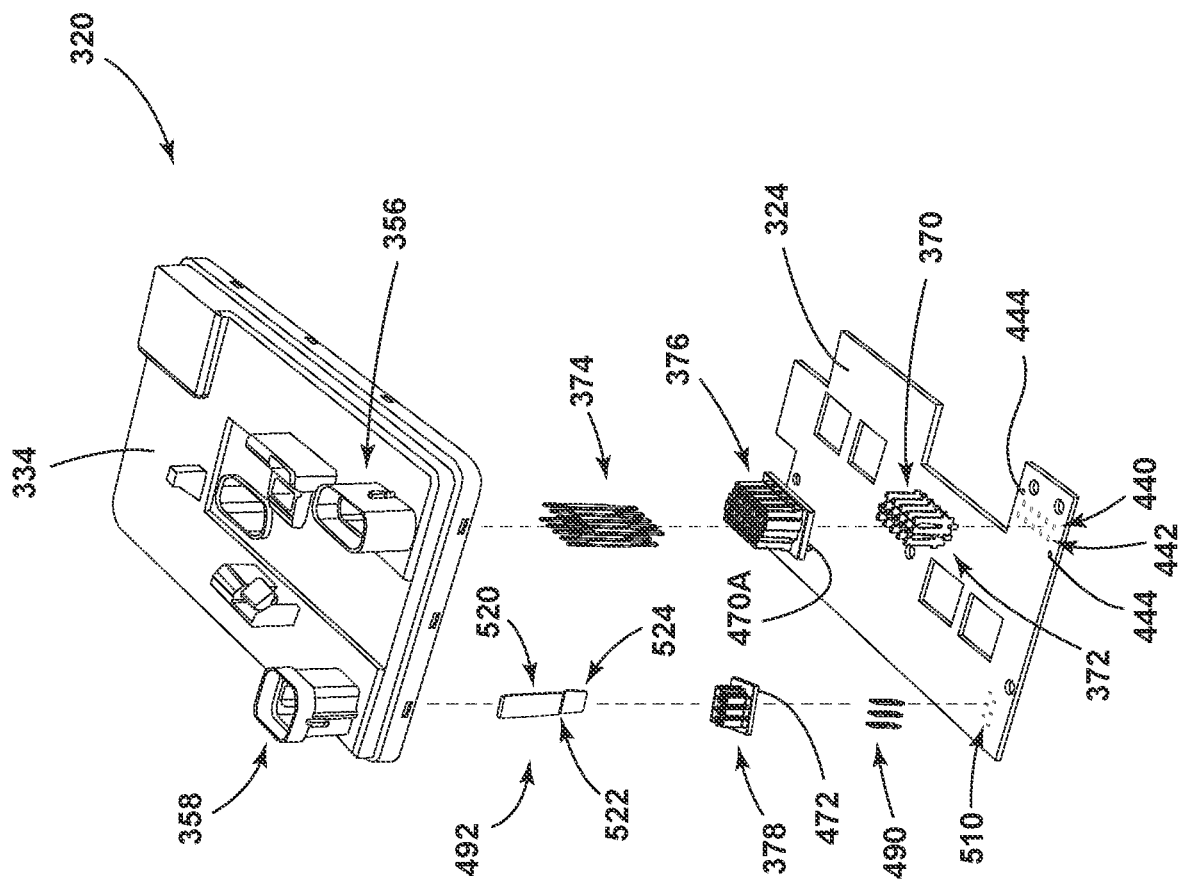
FIG. 19 is an exploded perspective view generally illustrating an embodiment of an electrical unit according to teachings of the present disclosure.

In embodiments, such as generally illustrated in FIG. 19 an electrical unit 320 may include one or more fourth terminals 490 that may be connected to the circuit board 324, and/or a fifth terminal 492 that may be connected with the one or more fourth terminals 490. The fourth terminals 490 may, for example, include the same or a similar configuration as the first terminals 370, and may include tabs 500 and/or mating portions 502 that may include prongs 404. The tabs 500 may be inserted into and/or soldered into fourth apertures 510 of the circuit board 324. The prongs 404 may, for example, extend substantially parallel to an X-Z plane. The fourth terminals 490 may be substantially planar and may, for example be spaced from each other by about 4 mm to about 5 mm, such as about 4.5 mm. The fourth terminals 490 may be spaced farther apart than the first and second terminals 370, 372, as higher currents may be provided to the fifth terminal 492 than the third terminals 374. For example, the fifth terminal 492 may be configured as a power terminal (e.g., for supplying the electrical unit 320 with electrical power) and the third terminals 374 may be configured as data terminals. The fourth terminals 490 may be aligned with each other in a row/column, such as to at least partially receive the fifth terminal 492. Multiple fourth terminals 490 may, for example, connect to the same fifth connector 492 to distribute a relatively high current from the fifth terminal 492.

With embodiments, a second terminal housing 378 may include one or more first recesses 512, such as for each fourth terminal 490. The first recesses 512 may, for example and without limitation, be configured in the same or a similar manner as the first recesses 460 of the first terminal housing 376. The first recesses 512 may extend upward from a bottom of the second terminal housing 378, such as generally parallel with a X-Z plane. The second terminal housing 378 may include one or more second recesses 514. The second recesses 514 may, for example and without limitation, be connected together (e.g., end-to-end) to form an elongated recess that may be configured to receive a third portion 524 of a fifth terminal 492, such as if the third portion 524 is configured as a blade (e.g., instead of having separate protrusions). The second recesses 514 may be substantially parallel with a Y-Z plane and/or may be substantially aligned with a middle of the prongs 394 (e.g., in an X-direction). The second terminal housing 378 may be disposed over the fourth terminals 490, such as until one or more housing tabs 472 snap into the circuit board 324.

In embodiments, such as generally illustrated in FIG. 19, a fifth terminal 492 may include a first portion 520, a second portion 522, and/or a third portion 524. The first portion 520 may be substantially parallel with the third portion 524. The second portion 522 may be substantially perpendicular to the first portion 520 and/or the third portion 524. The second portion 522 may connect the first portion 520 with the third portion 524. The third portion 524 may include a blade configuration or may include protrusions similar to those of the fifth terminal 192. The third portion 524 may be inserted into respective prongs 204, such as to electrically connect the fifth terminal 492 with the fourth terminals 490 and/or the circuit board 324. For example, the same fifth terminal 492 may be connected to a plurality of fourth terminals 490. The first portion 520 may be thicker than the second portion 522 and/or the third portion 522, such as to be compatible with one or more terminals 454A of an external connector 454. The third portion 524 may be thinner than the first portion 520, such as to be compatible with the fourth terminals 490.

In embodiments, a fifth terminal 492 may be inserted into the fourth terminals 490 and/or the second terminal housing 378, and the upper cover 334 may then be moved toward the circuit board 324 such that the fifth terminal 492 is inserted into terminal apertures 494 of an inner wall 496 of the second connector portion 358. The fifth terminal 492 may extend through the inner wall 496 for connection with connector terminals 354A of the second connector 354. For example and without limitation, moving the upper cover 334 toward the circuit board 324 may include inserting third terminals 374 into the first connector portion 356, and may include inserting a fifth terminal 192 into the second connector portion 358 (e.g., substantially simultaneously).

In some configurations, a fifth terminal 492 may be inserted into terminal apertures 494 of an inner wall 496 of the second connector portion 358 before being inserted into the fourth terminals 490 and/or corresponding recesses 514 of the second terminal housing 378. Then, moving the upper cover 334 toward the circuit board 324 may include inserting the fifth terminal 492 into the fourth terminals 490 and/or corresponding second recesses 514 of the second terminal housing 378, which may be an at least partially blind connection process. For example and without limitation, moving the upper cover 334 toward the circuit board 324 may include inserting third terminals 374 into first and second terminals 370, 372, and may include inserting a fifth terminal 492 into fourth terminals 490 (e.g., substantially simultaneously), either or both of which may be an at least partially blind connection process.

In embodiments, second recesses 514 may be tapered or chamfered, such as to facilitate insertion of a fifth terminal 492 into the fourth terminals 490 and/or into the second terminal housing 378.

With embodiments, in an assembled configuration, one or more third terminals 374 may extend out from an upper cover 334, such as at least partially in a first connector portion 356, and/or a fifth terminal 492 may extend out from an upper cover 336, such as least partially in a second connector portion 358.

In embodiments, an electrical unit 20, 320 may include more than one first terminal housing 76, 376 and/or more than one second terminal housing 78, 378 (and terminals 70, 72, 74, 190, 192, 370, 372, 375, 490, 492 associated therewith), such as if a connector wall 36 or a top cover 334 includes additional connector portions 56, 58, 356, 358.

Embodiments of electrical units 320 may, for example, be configured to compensate for wide tolerances (e.g., in a direction perpendicular to the circuit board 324), such as via an elongated connection between the third terminals 374 and the first and second terminals 370, 372, and/or via an elongated connection between the fifth terminal 492 and the fourth terminals 490. For example and without limitation, the prongs 394, 404 may be configured for electrical connection along some, a majority, or all of the first portions 450 of the third terminals 374, which may allow for various relative positions between the third terminals 374 and the first and second terminals 370, 372 to compensate for tolerances.

In embodiments, terminal housings (e.g., terminal housings 76, 78, 376, 378) may be configured to facilitate positioning of terminals (e.g., terminals 70, 72, 190, 370, 372, 490) on a circuit board 24, 324, and/or may facilitate insertion of terminals (e.g., terminals 74, 192, 374, 492), such as via centering terminals during insertion and/or via providing support during insertion (e.g., to limit damage to the terminals or the circuit board).

With embodiments, terminals of an electrical unit 20, 320 may be configured for various ranges of electrical current. For example and without limitation, terminals 70, 72, 74, 190, 370, 372, 374, 490 may be configured for currents of about 3 A to about 30 A, and/or terminals 192, 492 may be configured for currents of about 20 A to about 100 A. In some circumstances, smaller currents may involve smaller terminals and/or minimum separation distances.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

What is claimed is:

1. An electrical unit, comprising:
   a circuit board;
   a plurality of first terminals having respective first tabs and respective first mating portions, the first tabs substantially perpendicular to the first mating portions and fixed to the circuit board;
   a plurality of second terminals having respective second tabs and respective second mating portions, the second tabs substantially perpendicular to the second mating portions and fixed to the circuit board;
   a plurality of third terminals including a first male terminal and a second male terminal; and
   a terminal housing disposed over the plurality of first terminals and the plurality of second terminals, and connected to the circuit board;
   wherein the first male terminal is disposed at least partially in a first one of the plurality of first terminals and includes a first male terminal first portion and a first male terminal second portion;
   the second male terminal is disposed at least partially in a first one of the plurality of second terminals and includes a second male terminal first portion and a second male terminal second portion;
   at least two of the second tabs are offset from at least two of the first tabs in a first offset direction and a second offset direction;
   the first male terminal first portion and the second male terminal first portion are offset in the two offset directions; and
   the first male terminal second portion and the second male terminal second portion are substantially aligned in two alignment directions such that the first male terminal and the second male terminal convert a staggered configuration of the plurality of first terminals and the plurality of second terminals to a parallel configuration.

2. The electrical unit of claim 1, wherein top edges of the plurality of first terminals are disposed at a first distance from the circuit board;
   bottom edges of the plurality of second terminals are disposed at a second distance from the circuit board;
   the second distance is substantially equal to or less than the first distance;
   top edges of the plurality of second terminals are disposed at a third distance from the circuit board; and
   the third distance is greater than the first distance and the second distance.

3. The electrical unit of claim 2, including an electrical unit housing disposed at least partially around the circuit board and having a side wall and a connector wall.

4. The electrical unit of claim 3, wherein:
the first male terminal is disposed at least partially in the connector wall; and
the second male terminal is disposed at least partially in the connector wall.

5. The electrical unit of claim 4, wherein the terminal housing includes a plurality of first recesses, a plurality of second recesses, a plurality of third recesses, and a plurality of fourth recesses;
the plurality of first terminals are disposed in the plurality of first recesses;
the plurality of second terminals are disposed in the plurality of second recesses;
the first male terminal is disposed partially in a third recess of the plurality of third recesses;
the second male terminal is disposed partially in a fourth recess of the plurality of fourth recesses; and
the plurality of the third recesses and the plurality of fourth recesses are substantially perpendicular to the plurality of first recesses and the plurality of second recesses.

6. The electrical unit of claim 1, wherein:
the plurality of third terminals includes a plurality of first male terminals disposed at least partially in respective first terminals of the plurality of first terminals; and
the plurality of third terminals include a stepped configuration and are parallel to the circuit board.

7. The electrical unit of claim 6, wherein the terminal housing includes a plurality of recesses that facilitate insertion of the plurality of first male terminals into the plurality of first terminals.

8. The electrical unit of claim 1, wherein the terminal housing includes a plurality of first recesses, a plurality of second recesses, a plurality of third recesses, and a plurality of fourth recesses;
the plurality of third recesses and the plurality of fourth recesses are substantially perpendicular to the plurality of first recesses and the plurality of second recesses;
at least one third recess of the plurality of third recesses intersects with a respective first recess of the plurality of first recesses such that the at least one third recess is aligned with a middle of a pair of prongs of a first terminal of the plurality of first terminals; and
the plurality of fourth recesses intersect with respective second recesses of the plurality of second recesses.

9. The electrical unit of claim 8, wherein the plurality of first recesses and the plurality of second recesses extend to a front wall of the terminal housing;
the plurality of first recesses include a first height;
the plurality of second recesses include a second height; and
the second height is greater than the first height.

10. The electrical unit of claim 9, wherein the plurality of third recesses are disposed at a first distance from the circuit board;
the plurality of fourth recesses are disposed at a second distance from the circuit board;
the second distance is greater than the first distance; and
the plurality of third recesses and the plurality of fourth recesses are chamfered to facilitate insertion of the plurality of third terminals.

11. The electrical unit of claim 1, wherein the plurality of first terminals and the plurality of second terminals are planar terminals each including a pair of prongs;
the first offset direction is an X-direction and the second offset direction is a Y-direction; and
the prongs of the plurality of first terminals and the prongs of the plurality of second terminals are offset in the Y-direction and a Z-direction.

12. A method of assembling the electrical unit of claim 1, the method comprising:
connecting the first tabs of the plurality of first terminals with the circuit board;
connecting the second tabs of the plurality of second terminals with the circuit board such that each second tab is at least partially offset from each of the first tabs of the plurality of first terminals in the first offset direction and the second offset direction;
disposing the terminal housing over the plurality of first terminals and the plurality of second terminals; and
connecting the terminal housing to the circuit board.

13. The method of claim 12, wherein the terminal housing is disposed over the plurality of first terminals after the first tabs and the second tabs are connected to the circuit board.

14. A method of assembling an electrical unit, the method comprising:
connecting first tabs of a plurality of first terminals with a circuit board;
connecting second tabs of a plurality of second terminals with the circuit board such that each second tab is at least partially offset from each of the first tabs of the plurality of first terminals in a first offset direction and a second offset direction;
disposing a terminal housing over the plurality of first terminals and the plurality of second terminals;
connecting the terminal housing to the circuit board;
inserting a plurality of third terminals into a connector portion of a connector wall, the plurality of third terminals including a first male terminal and a second male terminal, the first male terminal including a first male terminal first portion and a first male terminal second portion, the second male terminal including a second male terminal first portion and a second male terminal second portion; and
moving the connector wall to insert the plurality of third terminals into the plurality of first terminals, the plurality of second terminals, and the terminal housing;
wherein moving the connector wall to insert the plurality of third terminals into the plurality of first terminals includes disposing the first male terminal at least partially in a first one of the plurality of first terminals;
wherein moving the connector wall to insert the plurality of third terminals into the plurality of second terminals includes disposing the second male terminal at least partially in a first one of the plurality of second terminals;
wherein the first male terminal first portion and the second male terminal first portion are offset in the two offset directions and the first male terminal second portion and the second male terminal second portion are substantially aligned in two alignment directions such that, after moving the connector wall, the first male terminal and the second male terminal convert a staggered configuration of the plurality of first terminals and the plurality of second terminals to a parallel configuration.

15. The method of claim 14, wherein the plurality of third terminals are disposed in a plurality of mirrored and stacked pairs.

16. The method of claim 14, including disposing an electrical unit housing at least partially around the circuit board, wherein front edges of the plurality of first terminals and the plurality of second terminals are substantially aligned with an edge of the circuit board;
a front wall of the terminal housing is substantially aligned with the edge of the circuit board;
a side wall of the electrical unit housing is disposed adjacent the front wall of the terminal housing and the edge of the circuit board; and
the connector wall is disposed adjacent the side wall.

17. A method of assembling an electrical unit, the method comprising:
connecting first tabs of a plurality of first terminals with a circuit board;
connecting second tabs of a plurality of second terminals with the circuit board such that each second tab is at least partially offset from each of the first tabs of the plurality of first terminals in a first direction and a second direction;
disposing a terminal housing over the plurality of first terminals and the plurality of second terminals;
connecting the terminal housing to the circuit board;
inserting a plurality of third terminals into a connector portion of a connector wall; and
moving the connector wall to insert the plurality of third terminals into the plurality of first terminals, the plurality of second terminals, and the terminal housing;
wherein the plurality of first terminals includes a first female terminal;
the plurality of second terminals includes a second female terminal;
the plurality of third terminals includes a first male terminal and a second male terminal;
the first male terminal includes a first male terminal first portion and a first male terminal second portion offset from the first male terminal first portion;
the second male terminal includes a second male terminal first portion and a second male terminal second portion offset from the second male terminal first portion;
after moving the connector wall, the first male terminal first portion is disposed at least partially in the first female terminal, and the second male terminal first portion is disposed at least partially in the second female terminal; and
the first male terminal second portion and the second male terminal second portion are offset in an offset direction and are substantially aligned in two alignment directions.

18. The method of claim 17, wherein the circuit board is substantially parallel to an X-Y plane and substantially perpendicular to a Z-direction; and
wherein the offset direction is the Z-direction, and the two alignment directions are an X-direction and a Y-direction.

19. The method of claim 17, including providing a plurality of fourth terminals;
fixing tabs of the plurality of fourth terminals with the circuit board;
disposing a second terminal housing over the plurality of fourth terminals;
connecting the second terminal housing with the circuit board; and
inserting a rear portion of a fifth terminal into a second connector portion of the connector wall;
wherein moving the connector wall includes inserting a front portion of the fifth terminal into the plurality of fourth terminals and the second terminal housing.

* * * * *